(12) United States Patent
Chen et al.

(10) Patent No.: US 12,417,927 B2
(45) Date of Patent: *Sep. 16, 2025

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Wei-Yu Chen, Taipei (TW); Hao-Jan Pei, Hsinchu (TW); Hsuan-Ting Kuo, Taichung (TW); Chih-Chiang Tsao, Taoyuan (TW); Jen-Jui Yu, Taipei (TW); Philip Yu-Shuan Chung, Taipei (TW); Chia-Lun Chang, Tainan (TW); Hsiu-Jen Lin, Zhubei (TW); Ching-Hua Hsieh, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/447,409

(22) Filed: Aug. 10, 2023

(65) Prior Publication Data
US 2023/0386862 A1 Nov. 30, 2023

Related U.S. Application Data

(63) Continuation of application No. 17/141,835, filed on Jan. 5, 2021, now Pat. No. 11,830,746.

(51) Int. Cl.
*B23K 1/00* (2006.01)
*H01L 21/48* (2006.01)
(Continued)

(52) U.S. Cl.
CPC ............ *H01L 21/50* (2013.01); *B23K 1/0016* (2013.01); *H01L 21/4853* (2013.01);
(Continued)

(58) Field of Classification Search
CPC ..... H01L 21/50; H01L 21/4853; H01L 24/10; H01L 2021/60135; H01L 2021/60225;
(Continued)

(56) References Cited

U.S. PATENT DOCUMENTS 5,346,118 A 9/1994 Degani et al.
5,492,266 A 2/1996 Hoebener et al.
(Continued)

FOREIGN PATENT DOCUMENTS

CN 1443625 A 9/2003
CN 101965632 A 2/2011
(Continued)

*Primary Examiner* — Kiley S Stoner
(74) *Attorney, Agent, or Firm* — Slater Matsil, LLP

(57) ABSTRACT

A method includes forming regions of solder paste on a redistribution structure, wherein the solder paste has a first melting temperature; forming solder bumps on an interconnect structure, wherein the solder bumps have a second melting temperature that is greater than the first melting temperature; placing the solder bumps on the regions of solder paste; performing a first reflow process at a first reflow temperature for a first duration of time, wherein the first reflow temperature is less than the second melting temperature; and after performing the first reflow process, performing a second reflow process at a second reflow temperature for a second duration of time, wherein the second reflow temperature is greater than the second melting temperature.

20 Claims, 18 Drawing Sheets

(51) Int. Cl.
*H01L 21/50* (2006.01)
*H01L 23/00* (2006.01)
H01L 21/60 (2006.01)

(52) U.S. Cl.
CPC .... *H01L 24/10* (2013.01); *H01L 2021/60135* (2013.01); *H01L 2021/60225* (2013.01)

(58) Field of Classification Search
CPC ..... H01L 21/6835; H01L 24/19; H01L 24/20; H01L 24/24; H01L 23/49816; H01L 23/5384; H01L 24/32; H01L 24/48; H01L 24/73; H01L 25/0657; H01L 25/105; H01L 2224/04105; H01L 2224/12105; H01L 2924/00014; H01L 23/5385; H01L 23/5383; H01L 2221/68345; H01L 2221/68381; H01L 2224/24137; H01L 2224/32145; H01L 2224/32225; H01L 2224/48091; H01L 2224/48227; H01L 2224/73265; H01L 2224/73267; H01L 2225/0651; H01L 2225/06568; H01L 2225/1035; H01L 2225/1041; H01L 2225/1058; H01L 2924/181; H01L 24/81; H01L 21/56; H01L 2224/81815; H01L 24/11; H01L 21/563; H01L 21/565; H01L 23/3185; H01L 24/13; H01L 2224/11849; H01L 2224/13111; H01L 2224/13113; B23K 1/0016; B23K 2101/36–42
USPC .......................... 228/179.1–180.22, 245–255
See application file for complete search history.

(56) References Cited

U.S. PATENT DOCUMENTS

| | | | |
|---|---|---|---|
| 5,493,075 A | 2/1996 | Chong et al. | |
| 5,796,169 A | 8/1998 | Dockerty et al. | |
| 5,907,187 A | 5/1999 | Koiwa et al. | |
| 5,931,371 A | 8/1999 | Pao et al. | |
| 5,956,606 A | 9/1999 | Burnette | |
| 6,018,197 A | 1/2000 | Saiki et al. | |
| 6,037,065 A | 3/2000 | Hajmrie et al. | |
| 6,043,990 A | 3/2000 | Johnson et al. | |
| 6,050,481 A | 4/2000 | Chapman et al. | |
| 6,342,443 B1 | 1/2002 | Tao et al. | |
| 6,686,665 B1 | 2/2004 | Gao et al. | |
| 7,202,569 B2 | 4/2007 | Tomono | |
| 8,188,380 B2 | 5/2012 | Kawai et al. | |
| 8,418,910 B2 | 4/2013 | Yamakami et al. | |
| 8,993,380 B2 | 3/2015 | Hou et al. | |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2003/0030149 A1 | 2/2003 | Miura et al. | |
| 2003/0089923 A1 | 5/2003 | Oida et al. | |
| 2003/0189260 A1 | 10/2003 | Tong et al. | |
| 2003/0224197 A1 | 12/2003 | Soga et al. | |
| 2004/0035917 A1* | 2/2004 | Koopmans | B23K 1/012 228/248.1 |
| 2005/0104171 A1* | 5/2005 | Benson | H01L 25/0657 257/E23.011 |
| 2005/0224560 A1 | 10/2005 | Takesue | |
| 2006/0180639 A1 | 8/2006 | Goudarzi et al. | |
| 2007/0069346 A1 | 3/2007 | Lin et al. | |
| 2007/0172690 A1 | 7/2007 | Kim et al. | |
| 2007/0245852 A1 | 10/2007 | Takaoka et al. | |
| 2008/0191347 A1 | 8/2008 | Sawa et al. | |
| 2008/0305581 A1 | 12/2008 | Skeete | |
| 2009/0039507 A1 | 2/2009 | Funaki | |
| 2011/0095423 A1 | 4/2011 | Ohashi et al. | |
| 2011/0143502 A1 | 6/2011 | Castro | |
| 2012/0017967 A1 | 1/2012 | Moon et al. | |
| 2012/0241965 A1 | 9/2012 | Hu et al. | |
| 2012/0267782 A1 | 10/2012 | Chen | |
| 2013/0105973 A1 | 5/2013 | Gan et al. | |
| 2013/0105991 A1 | 5/2013 | Gan et al. | |
| 2014/0291843 A1 | 10/2014 | Jiang et al. | |
| 2015/0049450 A1 | 2/2015 | Okamoto et al. | |
| 2015/0145130 A1 | 5/2015 | Lin et al. | |
| 2015/0325507 A1 | 11/2015 | Uzoh et al. | |
| 2016/0163668 A1 | 6/2016 | Hine et al. | |
| 2017/0053858 A1 | 2/2017 | Krajniak et al. | |
| 2017/0092619 A1 | 3/2017 | Refai-Ahmed et al. | |
| 2017/0179071 A1 | 6/2017 | Arvin et al. | |
| 2018/0233473 A1 | 8/2018 | Fukuhara et al. | |
| 2019/0371752 A1 | 12/2019 | Zhou et al. | |
| 2020/0006219 A1 | 1/2020 | Chen et al. | |
| 2020/0075488 A1 | 3/2020 | Wu et al. | |
| 2021/0305228 A1 | 9/2021 | Yang et al. | |
| 2021/0315107 A1 | 10/2021 | Vasudevan et al. | |
| 2022/0071013 A1* | 3/2022 | Morrison | H05K 1/181 |
| 2024/0379648 A1* | 11/2024 | Yang | H01L 21/4857 |

FOREIGN PATENT DOCUMENTS

| | | | | |
|---|---|---|---|---|
| CN | 104659002 A | | 5/2015 | |
| CN | 105938824 A | * | 9/2016 | ......... H01L 23/3128 |
| CN | 106558574 A | | 4/2017 | |
| CN | 106684033 A | | 5/2017 | |
| CN | 107393880 A | | 11/2017 | |
| CN | 108028225 A | * | 5/2018 | ......... H01L 21/4853 |
| CN | 109791894 A | * | 5/2019 | ............ H01L 21/31 |
| CN | 110660776 A | | 1/2020 | |
| CN | 110875196 A | | 3/2020 | |
| DE | 102004047730 A1 | | 4/2006 | |
| JP | H05283475 A | | 10/1993 | |
| JP | H0613541 A | | 1/1994 | |
| JP | H11186454 A | | 7/1999 | |
| JP | 2012039045 A | | 2/2012 | |
| KR | 100967668 B1 | | 7/2010 | |
| KR | 20120017967 A | | 2/2012 | |
| KR | 20150060559 A | | 6/2015 | |
| KR | 20190053333 A | | 5/2019 | |
| KR | 20200027419 A | | 3/2020 | |
| TW | 200839968 A | | 10/2008 | |
| TW | 201702395 A | | 1/2017 | |
| TW | 201803059 A | | 1/2018 | |
| TW | 202044507 A | * | 12/2020 | ............ H01L 21/56 |
| WO | 2016178000 A1 | | 11/2016 | |
| WO | 2017119937 A1 | | 7/2017 | |

* cited by examiner

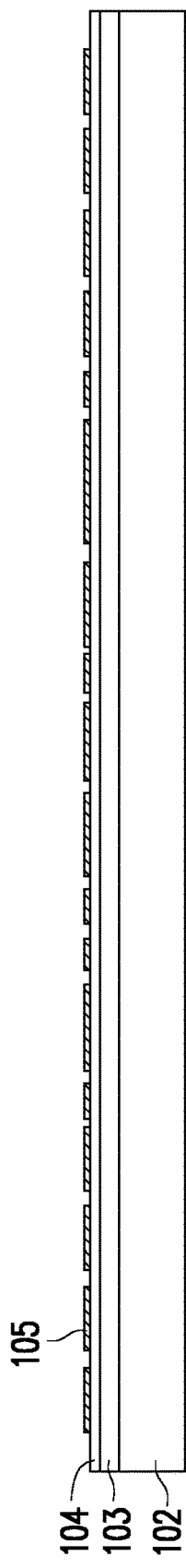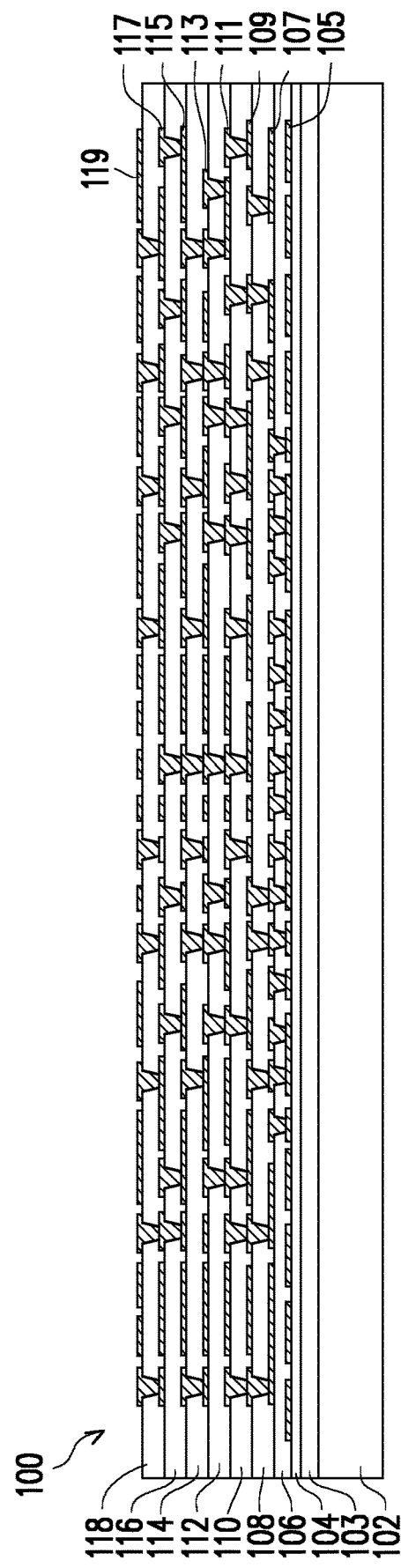

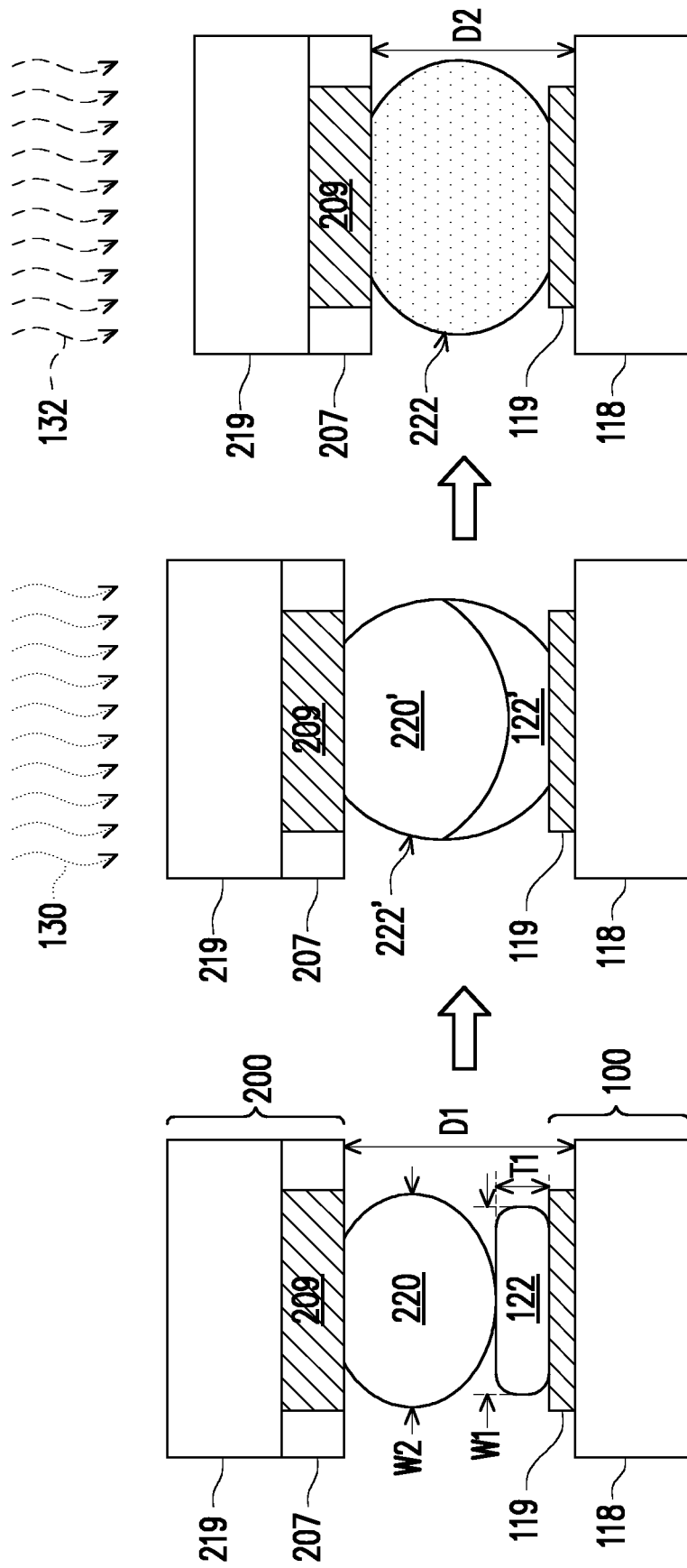

SEMICONDUCTOR DEVICE AND METHOD OF MANUFACTURE

PRIORITY CLAIM AND CROSS-REFERENCE

This application is a continuation of U.S. patent application Ser. No. 17/141,835, filed on Jan. 5, 2021, which application is hereby incorporated herein by reference.

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area. Integrated circuits with high functionality require many input/output pads. Yet, small packages may be desired for applications where miniaturization is important.

Integrated Fan-Out (InFO) package technology is becoming increasingly popular, particularly when combined with Wafer Level Packaging (WLP) technology in which integrated circuits are packaged in packages that typically include a redistribution layer (RDL) or post passivation interconnect that is used to fan-out wiring for contact pads of the package, so that electrical contacts can be made on a larger pitch than contact pads of the integrated circuit. Such resulting package structures provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 and 2 illustrate cross-sectional views of intermediate steps of forming a redistribution structure, in accordance with some embodiments.

FIGS. 6A, 6B, and 6C illustrate cross-sectional views of intermediate steps of bonding an interconnect structure to a redistribution structure, in accordance with some embodiments.

DETAILED DESCRIPTION

Figure 3:
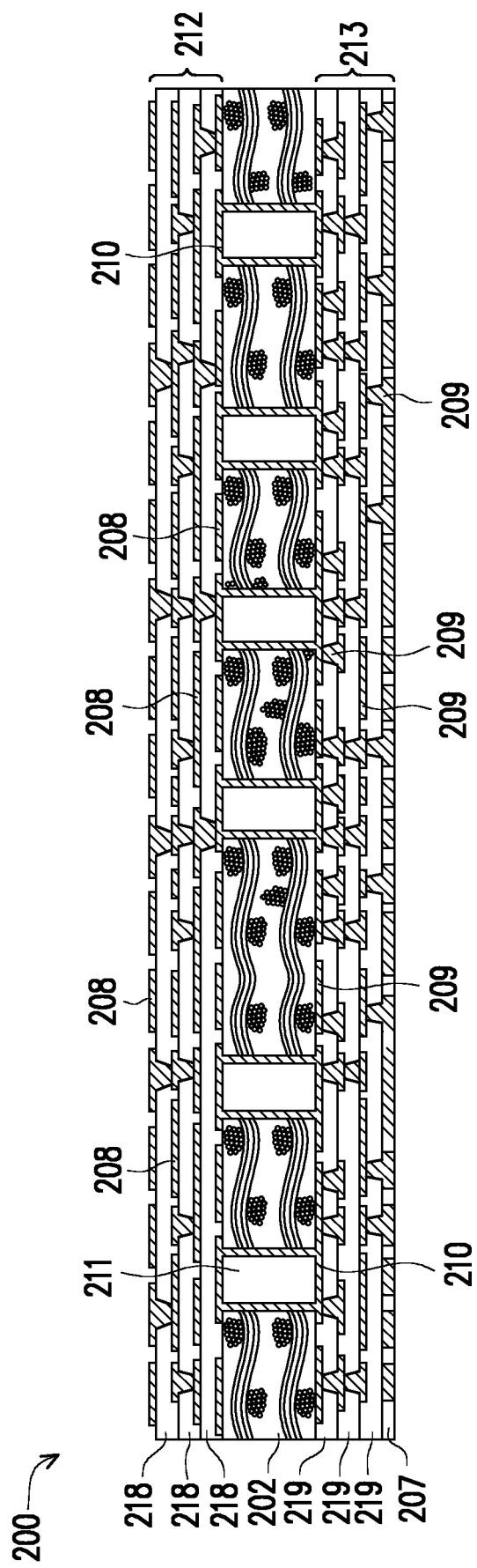
FIG. 3 illustrates a cross-sectional view of an interconnect structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a package structure and the formation thereof are described. In some embodiments, two separate reflows (one at a relatively low temperature and one at a relatively high temperature) are used to form joints between structures. The joints may be formed by applying a solder paste with a relatively low melting temperature to one structure and attaching solder bumps with a relatively high melting temperature to the other structure, and then using the two reflows to form joints from the solder paste and the solder bumps. Using the techniques described herein to form bonds within a package can result in reduced warping of the package structure after bonding. Reducing warping can reduce problems associated with warping and can improve performance and yield.

In some cases, the use of a connector formed from a low-temperature solder paste and a solder ball that are joined using a low-temperature reflow followed by a high-temperature reflow as described may improve the conduction and reliability of electrical connections between bonded structures. In some cases, the techniques described herein may be performed in a process flow with other typical fabrication processes, and thus may add little or no additional cost to existing processes. Additionally, using process techniques as described may result in improved yield and improved connection reliability, especially for packages having larger areas. For example, the process techniques described herein may reduce warpage and thus also reduce problems such as cracking or delamination associated with warping.

Turning to FIG. 1, there is shown a first carrier substrate 102 on which a metallization pattern 105 has been formed, in accordance with some embodiments. The first carrier substrate 102 may include, for example, silicon-based materials, such as a silicon substrate (e.g., a silicon wafer), a glass material, silicon oxide, or other materials, such as aluminum oxide, the like, or a combination. In some embodiments, the first carrier substrate 102 may be a panel structure, which may be, for example, a supporting substrate formed from a suitable dielectric material, such as a glass material, a plastic material, or an organic material. The panel structure may be, for example, a rectangular panel.

Figure 14A:
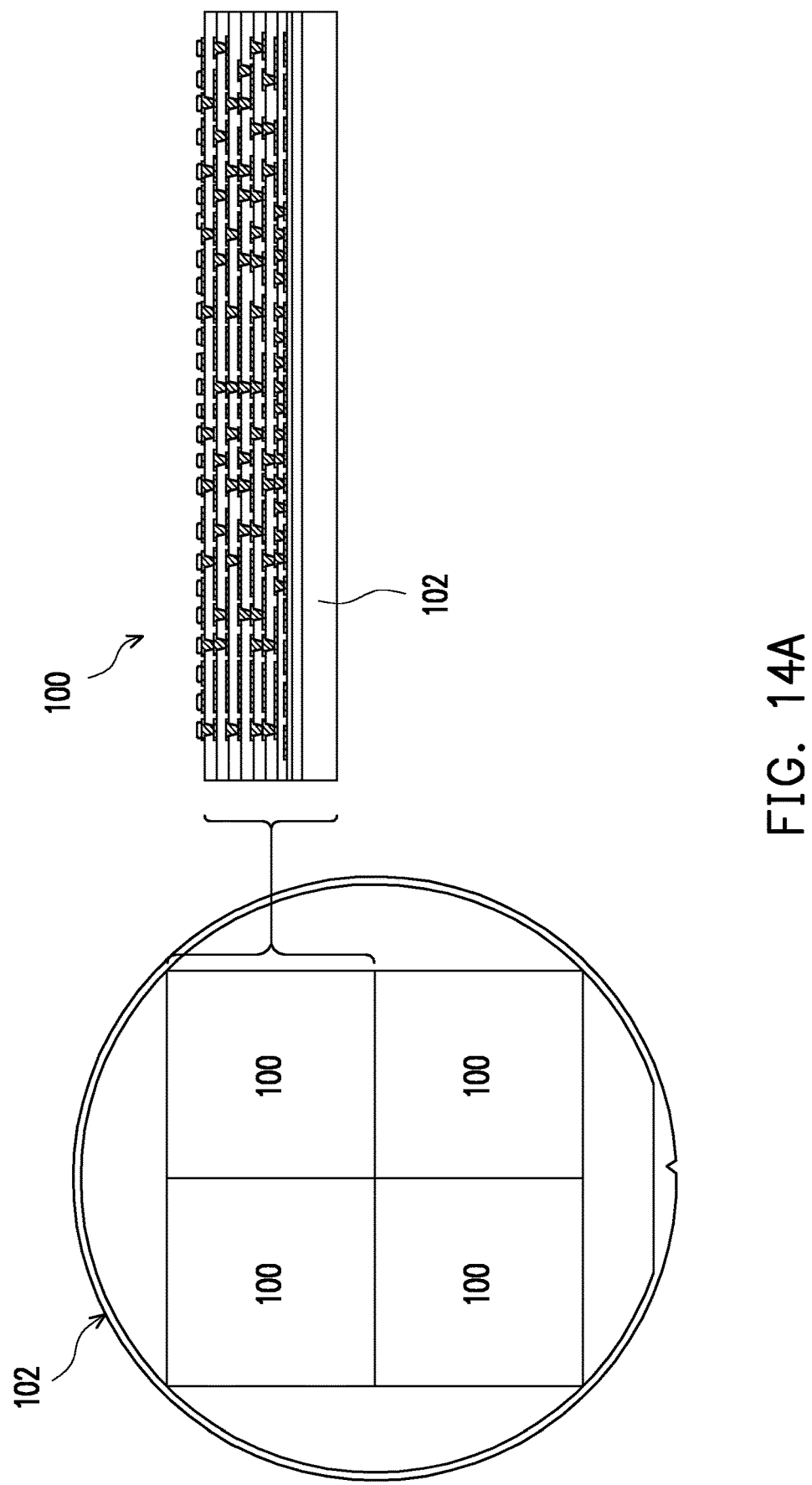
FIGS. 14A and 14B illustrate cross-sectional views of intermediate steps of bonding a redistribution structure on carrier substrates, in accordance with some embodiments.
Figure 14B:
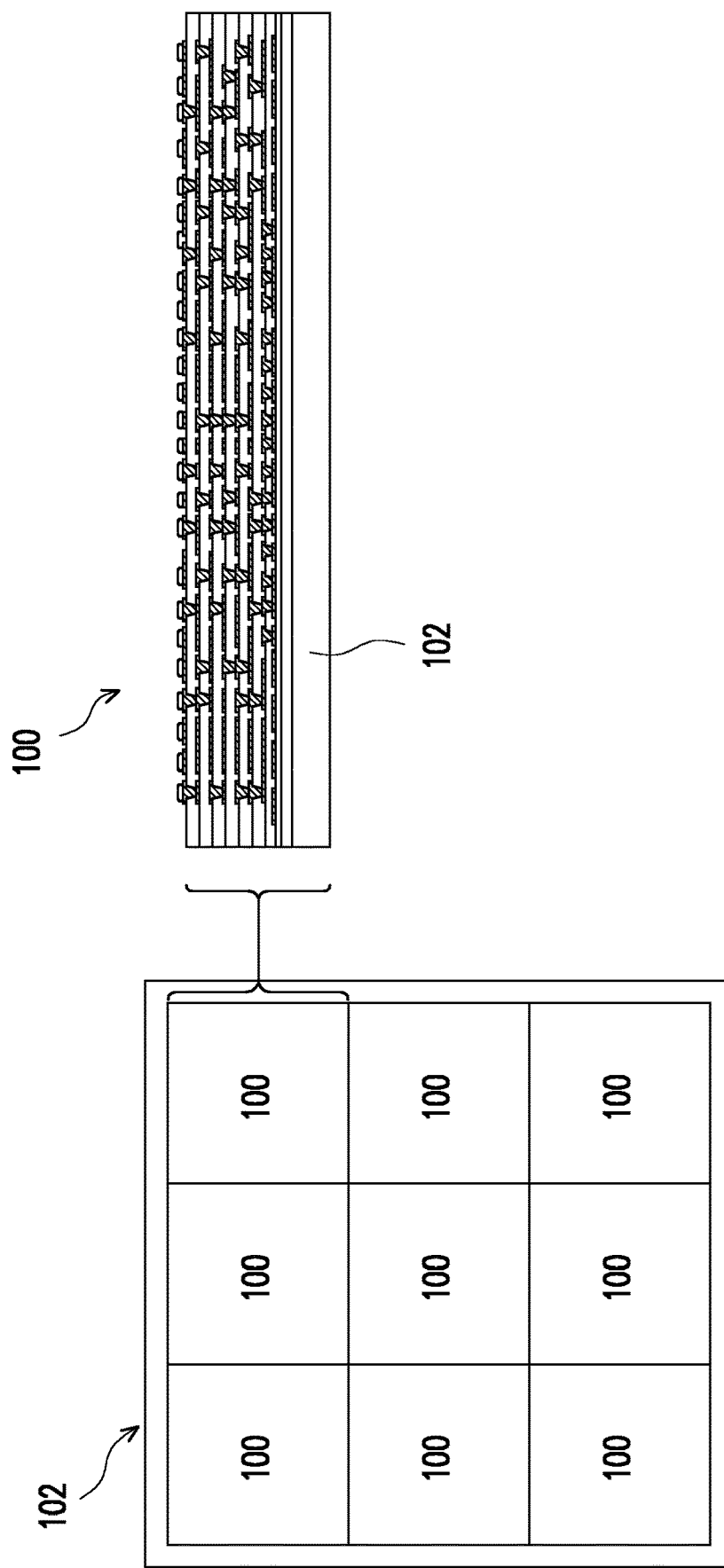

As illustrative examples, FIGS. 14A and 14B show structures (see FIG. 11) formed using different types of first carrier substrates 102, in accordance with some embodiments. FIG. 14A shows an embodiment in which the first carrier substrate 102 is a silicon wafer, and FIG. 14B shows an embodiment in which the first carrier substrate 102 is a panel structure. FIGS. 14A-14B show multiple redistribution structures 100 formed on the first carrier substrates 102. In this manner, multiple structures may be formed simultaneously on a first carrier substrate 102. The structures formed on the first carrier substrate 102 may be subsequently singulated (for example, see FIG. 12B).

In some embodiments, a release layer 103 may be formed on the top surface of the first carrier substrate 102 to facilitate subsequent debonding of first carrier substrate 102. The release layer 103 may be formed of a polymer-based material, which may be removed along with the first carrier substrate 102 from the overlying structures that will be formed in subsequent steps. In some embodiments, the release layer 103 is an epoxy-based thermal-release material, which loses its adhesive property when heated, such as a light-to-heat-conversion (LTHC) release coating. In other embodiments, the release layer 103 may be an ultra-violet (UV) glue, which loses its adhesive property when exposed to UV lights. The release layer 103 may be dispensed as a liquid and cured, may be a laminate film laminated onto the first carrier substrate 102, or may be the like. The top surface of the release layer 103 may be leveled and may have a high degree of planarity. In some embodiments, a die attach film (DAF) (not shown) may be used instead of or in addition to the release layer 103.

A dielectric layer 104 may be formed on the release layer 103, in some embodiments. The bottom surface of the dielectric layer 104 may be in contact with the top surface of the release layer 103. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, CVD, laminating, the like, or a combination thereof.

The metallization pattern 105 of the redistribution structure 100 may then be formed on the dielectric layer 104. The metallization pattern 105 may comprise, for example, conductive lines, redistribution layers or redistribution lines, contact pads, or other conductive features extending over a major surface of the dielectric layer 104. As an example to form the metallization pattern 105, a seed layer is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 105. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. Then, the photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the metallization pattern 105. Other techniques of forming the metallization pattern 105 are possible.

In FIG. 2, additional dielectric layers and metallization patterns of the redistribution structure 100 are formed over the dielectric layer 104 and the metallization pattern 105, in accordance with some embodiments. The redistribution structure 100 shown in FIG. 2 includes additional dielectric layers 106, 108, 110, 112, 114, 116, and 118; and additional metallization patterns 107, 109, 111, 113, 115, 117, and 119. The redistribution structure 100 is shown as an example having eight layers of metallization patterns, but more or fewer dielectric layers and metallization patterns may be formed in the redistribution structure 100. If fewer dielectric layers and metallization patterns are to be formed, some steps and processes discussed below may be omitted. If more dielectric layers and metallization patterns are to be formed, some steps and processes discussed below may be repeated.

The dielectric layer 106 may be deposited on the dielectric layer 104 and the metallization pattern 105. In some embodiments, the dielectric layer 106 is formed of a photosensitive material such as PBO, polyimide, BCB, or the like, which may be patterned using a lithography mask. The dielectric layer 106 may be formed by spin coating, lamination, CVD, the like, or a combination thereof. The dielectric layer 106 is then patterned. The patterning forms openings exposing portions of the metallization pattern 105. The patterning may be by an acceptable process, such as by exposing and developing the dielectric layer 106 to light when the dielectric layer 106 is a photo-sensitive material or by etching using, for example, an anisotropic etch.

The metallization pattern 107 is then formed. The metallization pattern 107 includes conductive elements extending along the major surface of the dielectric layer 106 and extending through the dielectric layer 106 to physically and electrically couple to the metallization pattern 105. As an example to form the metallization pattern 107, a seed layer is formed over the dielectric layer 106 and in the openings extending through the dielectric layer 106. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light for patterning. The pattern of the photoresist corresponds to the metallization pattern 107. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 107. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and the conductive material form the metallization pattern 107. In some embodiments, the metallization pattern 107 has a different size than the metallization pattern 105. For example, the conductive lines and/or vias of the metallization pattern 107 may be wider or thicker than those of the metallization pattern 105. Further, the metallization pattern 107 may be formed to a greater pitch than the metallization pattern 105.

The remaining dielectric layers and metallization patterns of the redistribution structure 100 may be formed in a similar manner as the dielectric layer 106 and the metallization pattern 107. For example, the dielectric layer 108 may be deposited on the metallization pattern 107 and dielectric layer 106. The dielectric layer 108 may be formed in a manner similar to the dielectric layer 106, and may be formed of a similar material as the dielectric layer 106. The metallization pattern 109 may then be formed. The metallization pattern 109 includes portions on and extending along the major surface of the dielectric layer 108 and portions extending through the dielectric layer 108 to physically and electrically couple to the metallization pattern 107. The metallization pattern 109 may be formed in a similar manner and of a similar material as the metallization pattern 107. In some embodiments, the metallization pattern 109 has a different size than the metallization pattern 107. For example, the conductive lines and/or vias of the metallization pattern 109 may be wider or thicker than the conductive lines and/or vias of the metallization pattern 107. Further, the metallization pattern 109 may be formed to a greater pitch than the metallization pattern 107.

The steps and processes described above for forming the dielectric layers 106 or 108 may be repeated to form the dielectric layers 110, 112, 114, 116, or 118. The steps and processes described above for forming the metallization patterns 107 or 109 may be repeated to form the metallization patterns 111, 113, 115, 117, or 119. As shown in FIG. 2, the dielectric layer 118 is the topmost dielectric layer of the redistribution structure 100 and the metallization pattern 119 is the topmost metallization pattern of the redistribution structure 100. As such, all of the intermediate metallization patterns of the redistribution structure 100 are disposed between the metallization pattern 119 and the metallization pattern 105. In some embodiments, the metallization pattern 119 has a different size than one or more of the intermediate metallization patterns. Further, the metallization pattern 119 may be formed to a greater pitch than one or more of the intermediate metallization patterns. In some embodiments, the metallization patterns 119 may be under-bump metallization structures (UBMs) of the redistribution structure 100.

FIG. 3 illustrates an interconnect structure 200, in accordance with some embodiments. The interconnect structure 200 is subsequently bonded to the redistribution structure 100 to form a bonded structure 300 (see FIG. 8) and provides additional routing and stability to the redistribution structure 100. For example, the interconnect structure 200 can reduce warping of the redistribution structure 100. In some embodiments, the interconnect structure 200 may be, for example, an interposer or a "semi-finished substrate," and may be free of active devices. In some embodiments, interconnect structure may include routing layers (e.g., routing structures 212 and 213) formed on a core substrate 202. The core substrate 202 may include a material such as Ajinomoto build-up film (ABF), a pre-impregnated composite fiber ("prepreg") material, an epoxy, a molding compound, an epoxy molding compound, fiberglass-reinforced resin materials, printed circuit board (PCB) materials, silica filler, polymer materials, polyimide materials, paper, glass fiber, non-woven glass fabric, glass, ceramic, other laminates, the like, or combinations thereof. In some embodiments, the core substrate may be a double-sided copper-clad laminate (CCL) substrate or the like. The core substrate 202 may have a thickness between about 30 μm and about 2000 μm, such as about 500 μm or about 1200 μm.

The interconnect structure 200 may have one or more routing structures 212/213 formed on each side of the core substrate 202 and through vias 210 extending through the core substrate 202. The routing structures 212/213 and through vias 210 provide additional electrical routing and interconnection. The through vias 210 may interconnect the routing structure 212 and the routing structure 213. The routing structures 212/213 may include one or more routing layers 208/209 and one or more dielectric layers 218/219. In some embodiments, the routing layers 208/209 and/or through vias 210 may comprise one or more layers of copper, nickel, aluminum, other conductive materials, the like, or a combination thereof. In some embodiments, the dielectric layers 218/219 may include materials such as a build-up material, ABF, a prepreg material, a laminate material, another material similar to those described above for the core substrate 202, the like, or combinations thereof. The interconnect structure 200 shown in FIG. 2 shows two routing structures 212/213 having a total of six routing layers, but in other embodiments the interconnect structure 200 may include only one routing structure (e.g. 212 or 213) or the routing structures 212/213 may include more or fewer routing layers.

In some embodiments, the openings in the core substrate 202 for the through vias 210 may be filled with a filler material 211. The filler material 211 may provide structural support and protection for the conductive material of the through vias 210. In some embodiments, the filler material 211 may be a material such as a molding material, epoxy, an epoxy molding compound, a resin, materials including monomers or oligomers, such as acrylated urethanes, rubber-modified acrylated epoxy resins, or multifunctional monomers, the like, or a combination thereof. In some embodiments, the filler material 211 may include pigments or dyes (e.g., for color), or other fillers and additives that modify rheology, improve adhesion, or affect other properties of the filler material 211. In some embodiments, the conductive material of the through vias 210 may completely fill the through vias 210, omitting the filler material 211.

In some embodiments, the interconnect structure 200 may include a passivation layer 207 formed over one or more sides of the interconnect structure 200. The passivation layer 207 may be a material such as a nitride, an oxide, a polyimide, a low-temp polyimide, a solder resist, combinations thereof, or the like. Once formed, the passivation layer 207 may be patterned (e.g., using a suitable photolithographic and etching process) to expose portions of the routing layers 208/209 of the routing structures 212/213.

Figure 4:
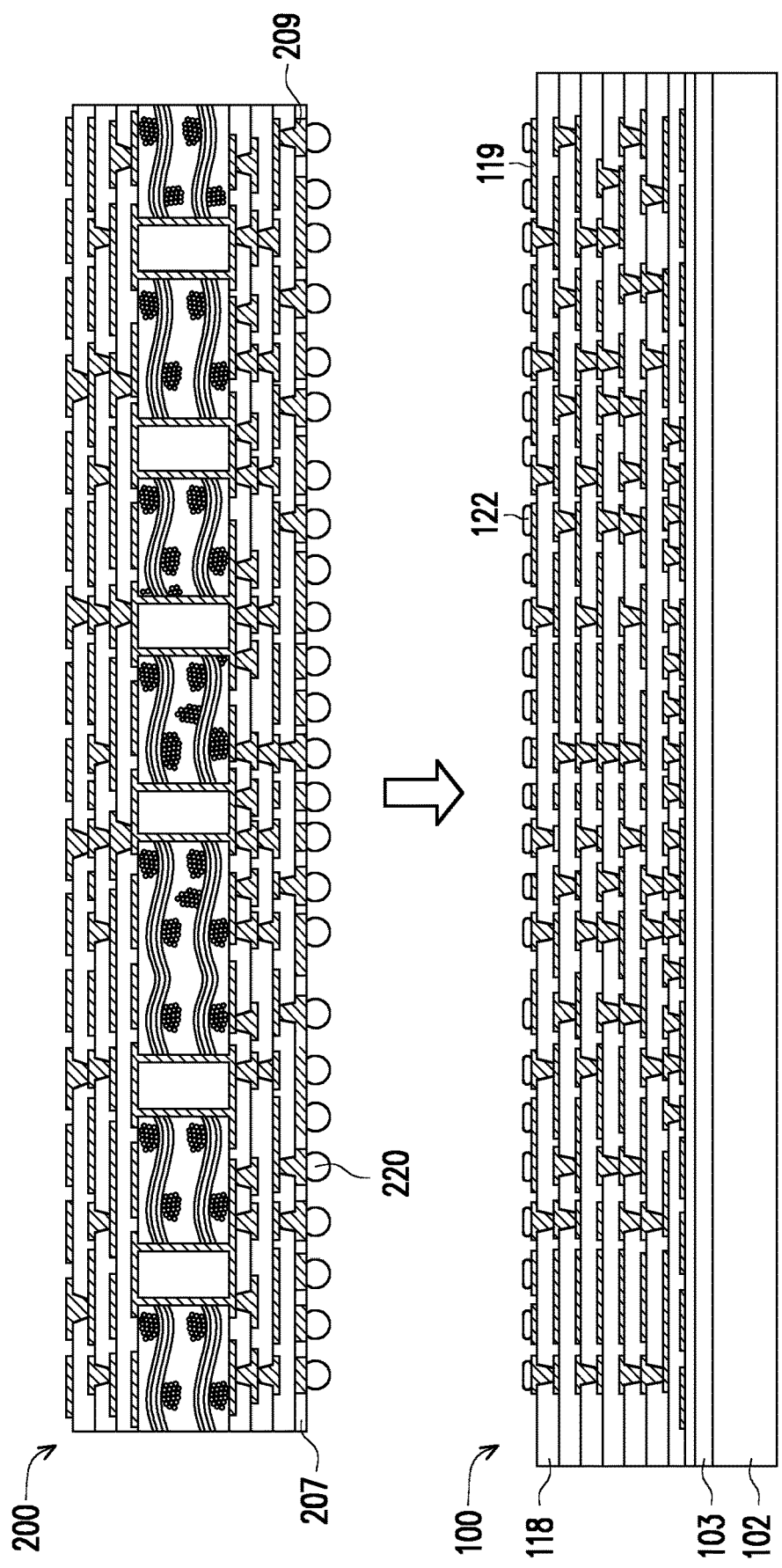
FIGS. 4 and 5 illustrate cross-sectional views of intermediate steps of bonding an interconnect structure to a redistribution structure, in accordance with some embodiments.

FIGS. 4 through 8 illustrate intermediate steps in the bonding of the interconnect structure 200 to the redistribution structure 100 to form a bonded structure 300 (see FIG. 8), in accordance with some embodiments. In FIG. 4, regions of a solder paste having a relatively low melting temperature ("LT paste") 122 are formed on the redistribution structure 100, and solder bumps 220 are formed on the interconnect structure 200, in accordance with some embodiments. The regions of LT paste 122 of the redistribution structure 100 may be bonded to corresponding solder bumps 220 of the interconnect structure 200 using a low-temperature reflow process ("LT reflow") 130 followed by a high-temperature reflow process ("HT reflow") 132, described below for FIGS. 6A-C. The use of the LT paste 122, the LT reflow 130, and the HT reflow 132 as described herein can reduce warping of a bonded structure such as the bonded structure 300. For example, in some cases the techniques described herein can reduce warping of a bonded structure 300 by between about 35% and about 50%. In some cases, the techniques described herein can result in warping of a bonded structure 300 that is less than about 1400 μm. The described embodiment includes the LT paste 122 formed on the redistribution structure 100 and solder bumps 220 formed on the interconnect structure 200, but in other embodiments, the LT paste 122 may be formed on the interconnect structure 200 and the solder bumps 220 may be formed on the redistribution structure 100.

Referring to FIG. 4, the solder bumps 220 may be formed on an outer routing layer (e.g., outermost routing layer 209) of the interconnect structure 200. The solder bumps 220 may be ball grid array (BGA) connectors, solder balls, metal pillars, controlled collapse chip connection (C4) bumps, micro bumps, electroless nickel-electroless palladium-immersion gold (ENEPIG) technique formed bumps, or the like. The solder bumps 220 may include a conductive material such as solder, copper, aluminum, gold, nickel, silver, palladium, tin, tin-silver-copper ("SAC"), the like, or a combination thereof. In some embodiments, the solder bumps 220 are formed by initially forming a layer of solder through evaporation, electroplating, printing, solder transfer, ball placement, or the like. Once a layer of solder has been formed on the structure, a reflow may be performed in order to shape the material into the desired bump shapes. In some embodiments, the solder bumps 220 are a material that has a melting point that is greater than the melting point of the LT paste 122. For example, the solder bumps 220 may have a melting point that is greater than about 210° C., and the LT paste 122 may have a melting point that is less than about 210° C. In some embodiments, the LT paste 122 may have a melting point that is greater than room temperature but less than 210° C., such as about 138° C. or another temperature. In some cases, using an LT paste 122 having a relatively lower melting point can reduce warping of a bonded structure, compared to using an LT paste 122 having a relatively higher melting point. Other materials and melting point temperatures are possible and considered within the scope of this disclosure.

Still referring to FIG. 4, regions of LT paste 122 may be formed on the topmost metallization pattern (e.g., metallization pattern 119) of the redistribution structure 100. In some embodiments, the LT paste 122 comprises a conductive material such as solder, solder paste, or the like. The LT paste 122 may be formed using any suitable process, such as a printing process, a stencil process, a dispensing process, or another process. Each region of LT paste 122 may be separated from neighboring regions of LT paste 122, and each region of LT paste 122 may have a corresponding solder bump 220 to which it is subsequently joined.

The regions of LT paste 122 may have a thickness T1 (see FIG. 6A) that is between about 50 μm and about 100 μm, though other thicknesses are possible. In some embodiments, the mass ratio of a region of LT paste 122 to its corresponding solder bump 220 is between about 1:2 and about 1:7, though other ratios are possible. In some embodiments, a region of LT paste 122 may have a width W1 (see FIG. 6A) that is between about 100 μm and about 250 μm or a solder bump 220 may have a width W2 (see FIG. 6A) that is between about 200 μm and about 400 μm, though other widths are possible. The width ratio of W1:W2 may be between about 1:2 and about 1:4, though other ratios are possible. In some embodiments, the shape of a connector 222 (see FIG. 6C) may be controlled by controlling the thickness T1, the mass ratio of LT paste 122 to solder bumps 220, the widths or width ratio of the regions of LT paste 122 and the solder bumps 220, or other characteristics. Controlling the shape of the connectors 222 in this manner is described in greater detail below for FIGS. 6A-7C.

In some embodiments, the LT paste 122 may comprise tin-bismuth (SnBi) or a combination of tin-bismuth and other metals, such as silver, antimony, copper, nickel, or the like. In some embodiments, the LT paste 122 comprises between about 35% bismuth by mass and about 58% bismuth by mass, though other amounts are possible. For example, the mass ratio of tin to bismuth may be between about 65:35 and about 42:58, although other ratios are possible. In some cases, a relatively smaller proportion of bismuth in the LT paste 122 may form initial connectors 222' or connectors 222 (see FIGS. 6A-C) that are less brittle, which can improve reliability and yield of a bonded structure. The LT paste 122 may be, for example, Sn-58Bi, Sn-57Bi-1Ag, Sn-40Bi-Cu—Ni, Sn-58Bi-Sb—Ni, Sn-35Bi-0.5Cu-0.03Ni, or the like. These are example materials that may be used for the LT paste 122, and other materials than these may be used in other embodiments. In some embodiments, the LT paste 122 is a material that has a melting point lower than the melting point of the solder bumps 220. For example, the LT paste 122 may be tin-bismuth, which has a melting point of about 139° C., and the solder bumps 220 may be tin-silver-copper (SAC), which has a melting point of about 217° C. This is an example, and other materials or melting point temperatures than these are within the scope of this disclosure.

Figure 5:
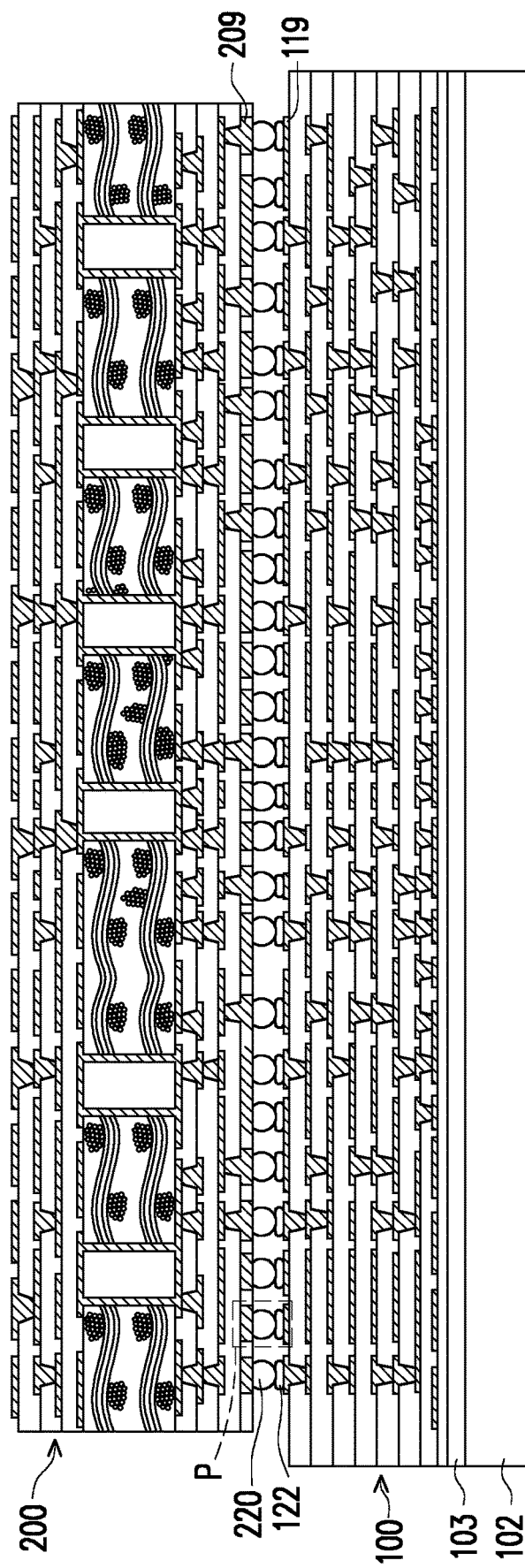

FIG. 5 illustrates a placement of the solder bumps 220 of the interconnect structure 200 into physical contact with the LT paste 122 on the redistribution structure 100. The interconnect structure 200 may be placed on the redistribution structure 100 using, e.g., a pick-and-place process. As shown in FIG. 5, each solder bump 220 physically contacts a corresponding region of LT paste 122. In other embodiments, more than one solder bump 220 may physically contact the same region of LT paste 122.

Turning to FIGS. 6A-C, a low-temperature reflow process ("LT reflow") 130 and a high-temperature reflow process ("HT reflow") 132 are performed to bond the solder bumps 220 to the LT paste 122, forming connectors 222. In some embodiments, the LT reflow 130 is performed first, and the HT reflow 132 is performed second. The HT reflow 132 is performed using a greater process temperature than the LT reflow 130. For clarity, FIGS. 6A-C illustrate a magnified view of the portion labeled "P" in FIG. 5. FIG. 6A illustrates the structure after the solder bumps 220 have been placed in contact with the regions of LT paste 122, similar to the structure shown in FIG. 5.

In FIG. 6B, the LT reflow 130 is performed to initially bond the solder bumps 220 of the interconnect structure 200 to the LT paste 122 of the redistribution structure 100. The LT reflow 130 may be performed using a temperature that is greater than the melting point of the LT paste 122 but that is less than the melting point of the solder bumps 220. In this manner, the LT reflow 130 melts the LT paste 122 and forms a bond between the LT paste 122 and the solder bumps 220 without melting the solder bumps 220. As shown in FIG. 6B, the LT reflow 130 bonds the solder bumps 220 and the LT paste 122 to form initial connectors 222'. In some cases, the initial connectors 222' may be considered temporary connectors that initially bond the interconnect structure 200 to the redistribution structure 100.

In some cases, the use of the LT reflow 130 to form initial connectors 222' by melting the LT paste 122 can result in less warping of the bonded structure 300. For example, the change in the size of a material due to an increase of the material's temperature can be proportional to the temperature increase and proportional to the coefficient of thermal expansion (CTE) of the material. Thus, a smaller temperature increase can produce a smaller change in size. In some cases, if the redistribution structure 100 has a different overall CTE than the interconnect structure 200, then, for a given increase of temperature, the relative size change of the redistribution structure 100 is different from the relative size change of the interconnect structure 200. When the redistribution structure 100 is bonded to the interconnect structure 200 to form the bonded structure 300 (see FIG. 8), the mismatched size changes of the redistribution structure 100 and the interconnect structure 200 can cause warping of the bonded structure 300. Thus, the relatively lower temperature used in the LT reflow 130 can reduce warping or bending during formation of a bonded structure such as the bonded structure 300. In some embodiments, the LT reflow 130 is performed at a temperature that is between about 130° C. and about 180° C., though other temperatures are possible. The temperature used for the LT reflow 130 may depend on the particular composition of the LT paste 122. In some embodiments, the LT reflow 130 is performed for a time between about 100 seconds and about 200 seconds, though other times are possible.

In some cases, the LT reflow 130 may soften the solder bumps 220 such that the solder bumps 220 change shape, as shown in FIG. 6B. In other cases, the solder bumps 220 may substantially maintain their shape during the LT reflow 130. The LT reflow 130 may form initial connectors 222' having regions with different compositions. Referring to FIG. 6B, an initial connector 222' may include a region 220' having a composition similar to the solder bumps 220 and a region 122' having a composition similar to the LT paste 122. For example, in embodiments in which the LT paste 122 includes a greater concentration of bismuth than the solder bumps 220, the region 122' may have a greater concentration of bismuth than the region 220'. The interface between a region 122' and a region 220' may be abrupt or gradual or may be a combination of these. The regions 122' or 220' may have different shapes, sizes, or compositions than these examples.

In FIG. 6C, the HT reflow 132 is performed to form connectors 222 from the initial connectors 222', in accordance with some embodiments. The HT reflow 132 may be performed using a temperature that is greater than the melting point of the solder bumps 220 (or the regions 220'). In this manner, the HT reflow 132 melts the solder bumps 220 and the LT paste 122 bonded thereon to form connectors 222. The connectors 222 may form a stronger bond than the initial connectors 222', which can improve reliability and structural stability of the bonded structure 300. In some embodiments, the HT reflow 132 is performed at a temperature that is between about 210° C. and about 250° C., though other temperatures are possible. In some embodiments, the HT reflow 132 is performed for a time between about 50 seconds and about 80 seconds, though other times are possible. The HT reflow 132 may be performed immediately after the LT reflow 130, or the HT reflow 132 may be performed in a separate process after performing the LT reflow 130. Because the redistribution structure 100 and the interconnect structure 200 are already bonded by the initial connectors 222' when the HT reflow 132 is performed, any warping caused by the relatively high temperature of the HT reflow 132 is less than if the initial connectors 222' were not formed. In some cases, the HT reflow 132 does not cause significant additional warping, and most of the warping of the bonded structure 300 occurs during the LT reflow 130. In this manner, the amount of warping of the bonded structure 300 may be controlled by controlling the parameters of the LT reflow 130. Performing an LT reflow 130 before performing an HT reflow 132 as described herein can thus reduce warping of a bonded structure 300, which can reduce the occurrence of defects such as debonding, delamination, joint failure, cracking, etc.

In some embodiments, the HT reflow 132 may reduce the separation distance between the redistribution structure 100 and the interconnect structure 200 during formation of the connectors 222. For example, prior to forming the LT reflow 130, the redistribution structure 100 and the interconnect structure 200 may be separated by a distance D1, as shown in FIG. 6A. The separation distance D1 may be between about 300 μm and about 500 μm, though other distances are possible. After performing the HT reflow 132, the redistribution structure 100 and the interconnect structure 200 may be separated by a distance D2 that is less than D1, such as a distance D2 that is between about 250 μm and about 400 μm, though other distances are possible. In this manner, after performing the HT reflow 132, the separation distance D1 may be reduced (e.g., D1-D2) by between about 0 μm and about 10 μm. In some cases, reducing the separation distance can reduce warping and improve the connections between redistribution structure 100 and the interconnect structure 200. In some cases, the separation distance D1 or the separation distance D2 may be different at different locations. For example, warping may result in the separation distance (D1 or D2) being different near the center of the bonded structure 300 than near the edges of the bonded structure 300. In some cases, the LT reflow 130 may also reduce the separation distance.

The connectors 222 formed by the HT reflow 132 may have a substantially homogeneous composition or an inhomogeneous composition. As an example of a homogeneous composition, the connectors 222 may be formed having substantially the same concentration of bismuth throughout. In some embodiments, the connectors 222 may be formed having a homogeneous composition comprising between about 4% bismuth by mass and about 20% bismuth by mass. As an another example of a homogeneous composition, the connectors 222 may be formed having substantially the same mass ratio of tin to bismuth throughout, such as between about 5:1 and about 8:1. As an example of a inhomogeneous composition, the connectors 222 may be formed having a larger atomic concentration of bismuth near the side of the connectors 222 where the LT paste 122 was formed than near the side of the connectors 222 where the solder bumps 220 were formed. These are examples, and other compositions, materials, concentrations, or mass ratios are possible. In some cases, a HT reflow 132 having a greater temperature and/or a longer time may form a more homogeneous connector 222. In some cases, connectors 222 having a smaller concentration of bismuth may have greater structural integrity and be less prone to cracking. In some cases, connectors 222 having a more homogeneous composition may have greater structural integrity, greater uniformity of conductivity, and be less prone to failure, cracking, debonding, or the like.

In some embodiments, the shape of the connectors 222 can be controlled by controlling the size or shape of the regions of LT paste 122; the size or shape of the solder bumps 220; the temperature or time of the LT reflow 130; and/or the temperature or time of the HT reflow 132. Controlling the shape of the connectors 222 may allow for improved design flexibility, such as controlling the shape of the connectors 222 to reduce bridging or to be compatible with a certain pitch, connector size, or expected warping of the bonded structure 300. As an example, FIGS. 6A-6C show an embodiment in which the connector 222 is formed having a round shape (e.g., having convex sidewalls). In some cases, performing the HT reflow 132 using a higher temperature and/or for a longer duration of time may form connectors 222 having a rounder shape than performing an HT reflow 132 using a lower temperature and/or for a shorter duration of time.

Figure 7A:
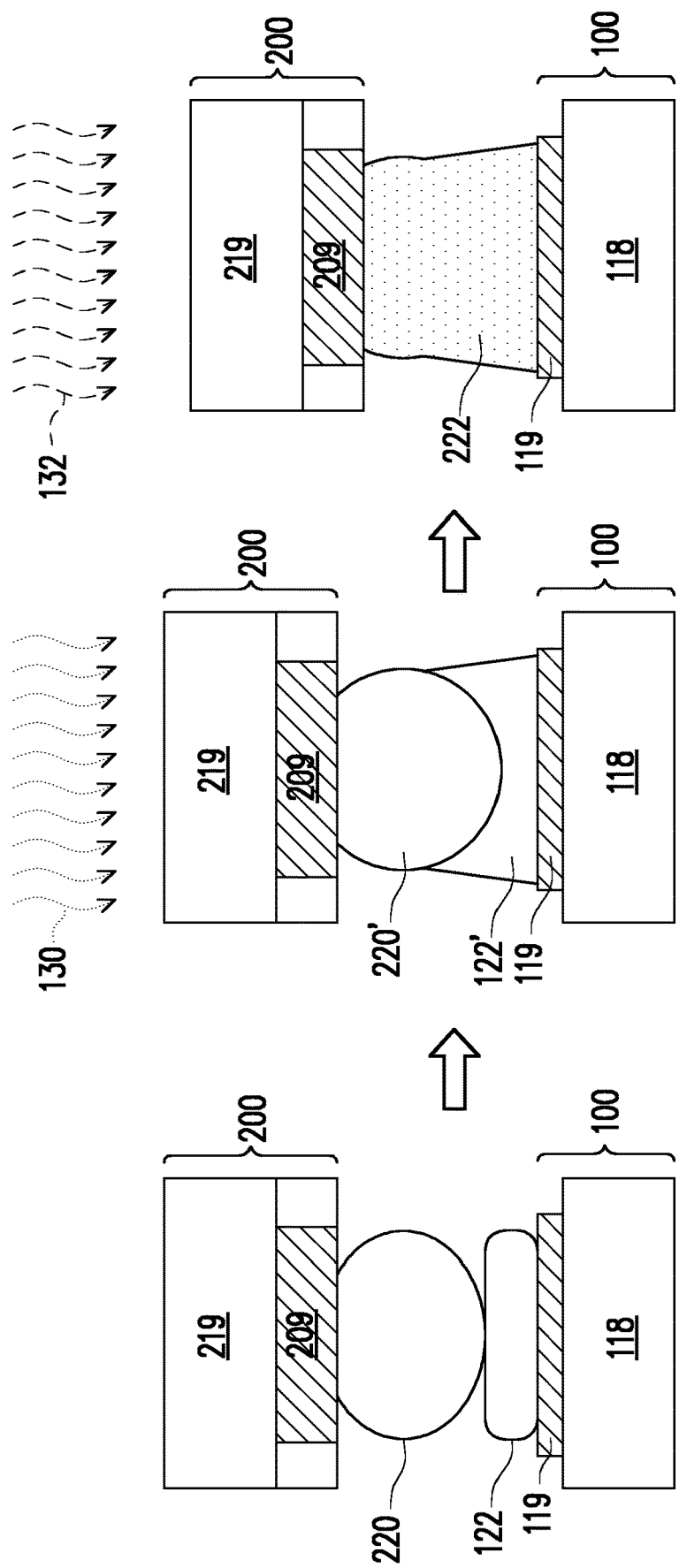
FIGS. 7A, 7B, and 7C illustrate cross-sectional views of intermediate steps of bonding an interconnect structure to a redistribution structure, in accordance with some embodiments.
Figure 7B:
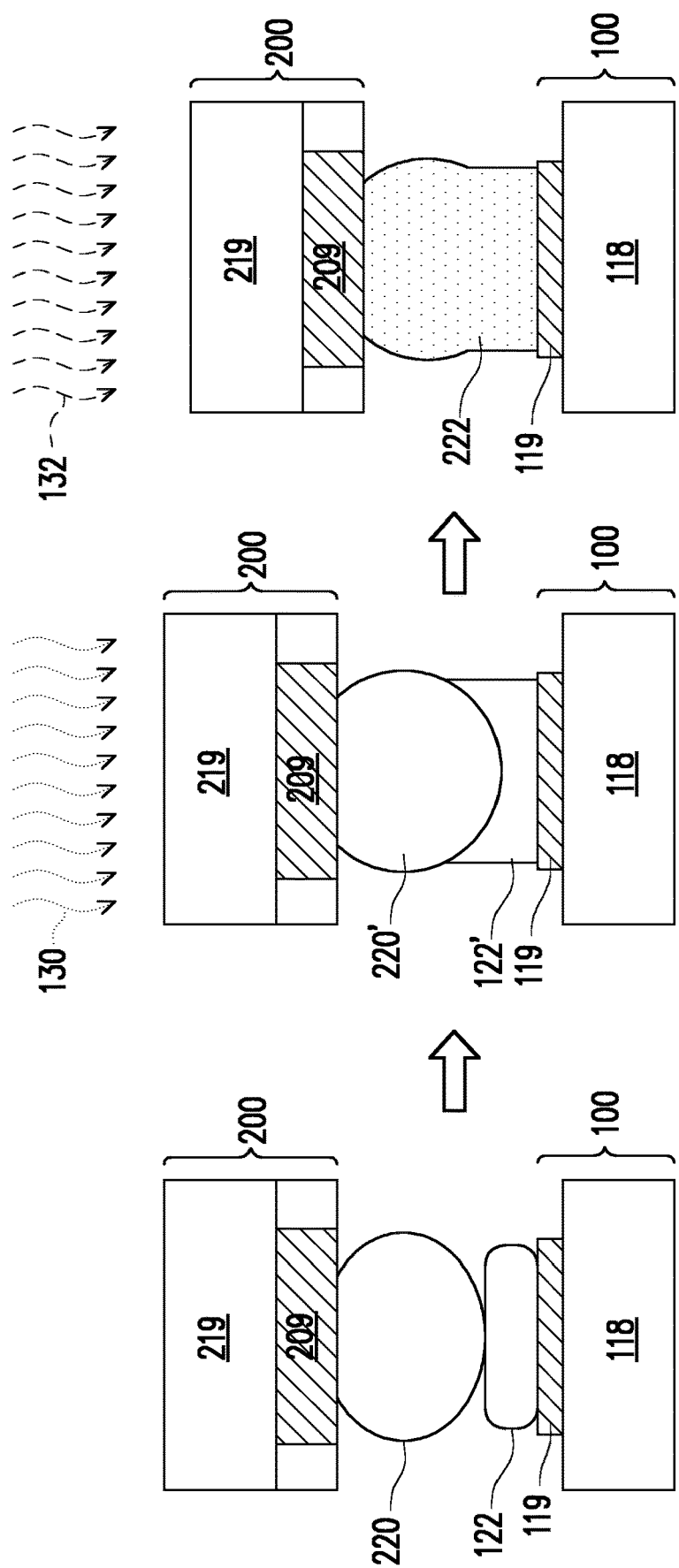
Figure 7C:
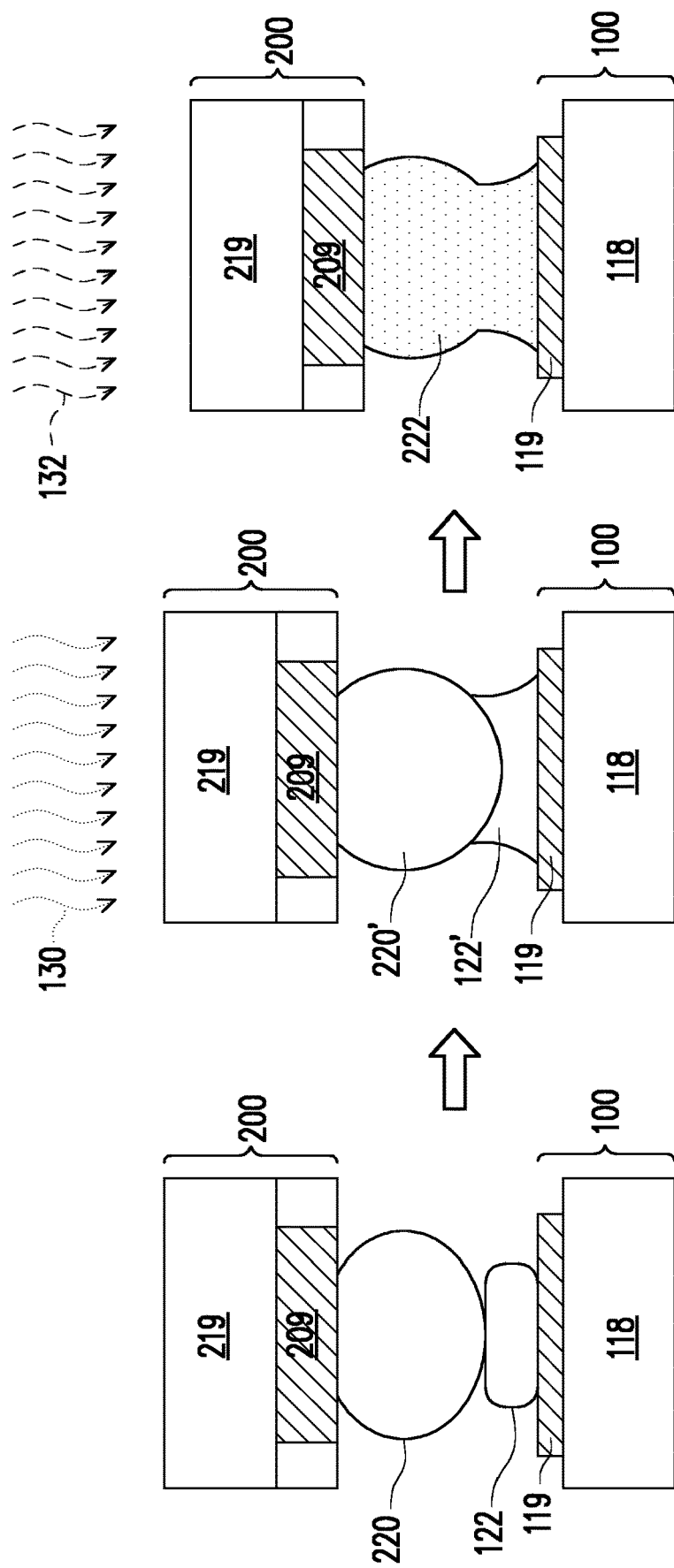

Other shapes of the connectors 222 may be formed, such as connectors 222 having tapered sidewalls, straight sidewalls, vertical sidewalls, concave sidewalls, irregular sidewalls, asymmetric sidewalls, or sidewalls having other profiles. For example, FIGS. 7A-7C illustrate connectors 222 formed having other shapes. The connector 222 shapes shown in FIGS. 7A-7C are examples, and other shapes than these may be formed and are considered within the scope of this disclosure. The shapes shown in FIGS. 6A-7C may be formed using techniques that are different than the techniques described herein.

FIG. 7A shows the formation of a connector 222 having tapered sidewalls in which the width of the connector 222 is greatest near the redistribution structure 100. For example, the width of the connectors 222 near the redistribution structure 100 may be greater than the width W2 of the solder bumps 220. The tapered sidewalls of the connectors 222 may be approximately straight or may be approximately straight near the redistribution structure 100, as shown in FIG. 7A. In some cases, connectors 222 having a shape similar to that shown in FIG. 7A may be formed by using a relatively large ratio of LT paste 122 to solder bump 220. For example, a mass ratio of LT paste 122 to solder bump 220 that is between about 1:8 and about 1:16 may be used. In some cases, a relatively large width ratio W1:W2 (see FIG. 6A) may be used, such as a width ratio between about 1:2 and about 1:4. FIG. 7B shows the formation of a connector 222 having approximately vertical sidewalls. The connector 222 may be formed having about the same width as W1 or W2 or may be formed having a different width. The vertical sidewalls of the connectors 222 may be approximately straight or may be approximately straight near the redistribution structure 100, as shown in FIG. 7B. In some cases, connectors 222 having a shape similar to that shown in FIG. 7B may be formed by using an appropriate ratio of LT paste 122 to solder bump 220. For example, a mass ratio of LT paste 122 to solder bump 220 that is between about 1:8 and about 1:16 may be used. In some cases, a width ratio W1:W2 may be used, such as a width ratio between about 1:2 and about 1:4. FIG. 7C shows the formation of a connector 222 having concave sidewalls. In some cases, connectors 222 having a shape similar to that shown in FIG. 7C may be formed by using a relatively small ratio of LT paste 122 to solder bump 220. For example, a mass ratio of LT paste 122 to solder bump 220 that is between about 1:8 and about 1:16 may be used. In some cases, a relatively small width ratio W1:W2 may be used, such as a width ratio between about 1:2 and about 1:4.

Figure 8:
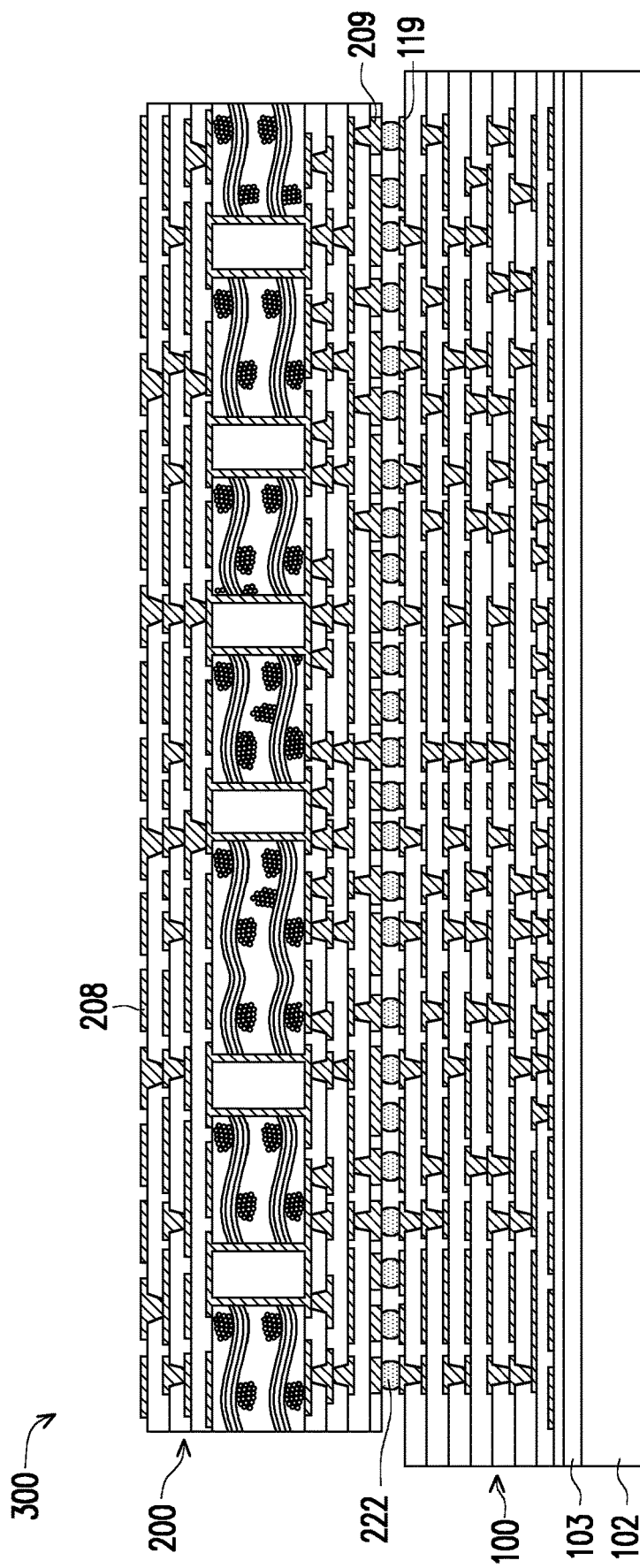
FIGS. 8, 9, 10, 11, 12A, and 12B illustrate cross-sectional views of intermediate steps of forming a bonded structure, in accordance with some embodiments.

Turning to FIG. 8, the redistribution structure 100 is shown bonded to the interconnect structure 200 by the connectors 222 to form a bonded structure 300, in accordance with some embodiments. The connectors 222 may be formed using the techniques described above for FIGS. 5-7C in order to reduce warping of the bonded structure 300.

Figure 9:
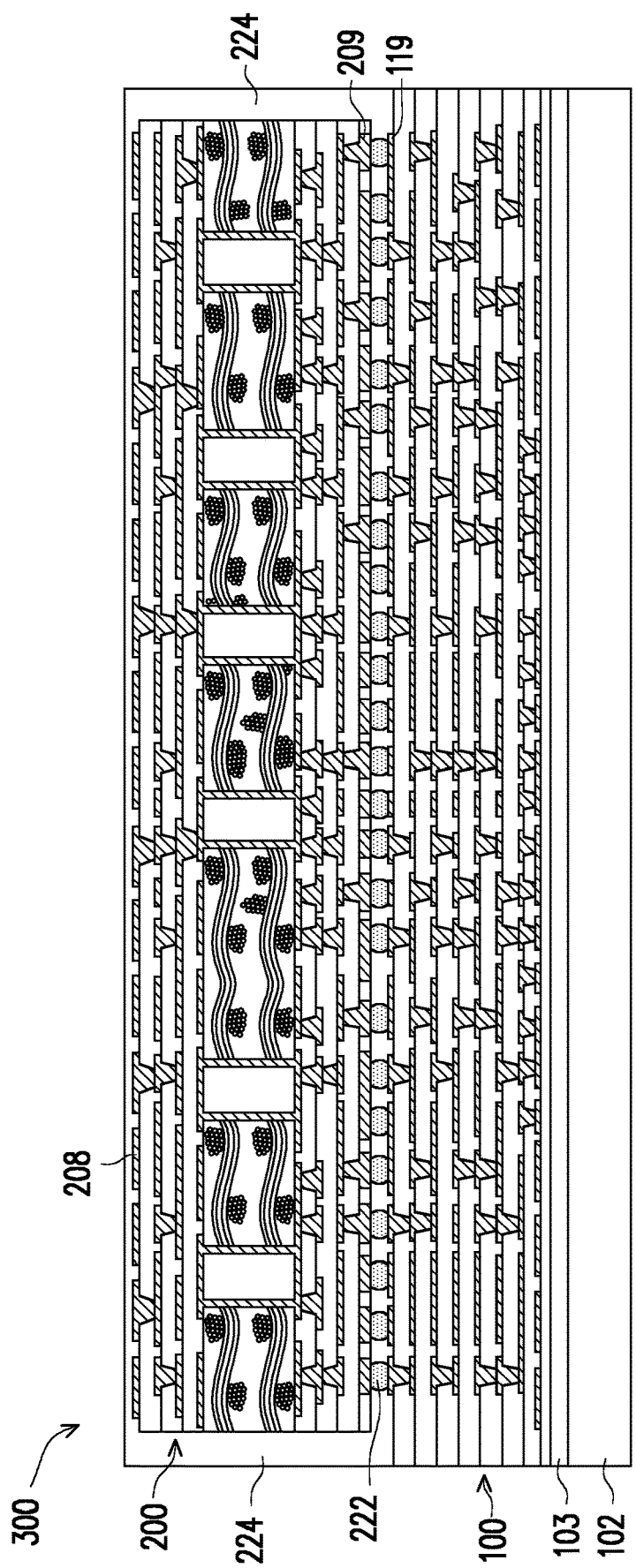

In FIG. 9, an underfill 224 is deposited along the sidewalls of the interconnect structure 200 and in the gap between the interconnect structure 200 and the redistribution structure 100. The underfill 224 may be a material such as a molding compound, an encapsulant, an epoxy, an underfill, a molding underfill (MUF), a resin, or the like. The underfill 224 can protect the connectors 222 and provide structural support for the bonded structure 300. In some embodiments, the underfill 224 may be applied in liquid or semi-liquid form and then subsequently cured. In some embodiments, the underfill 224 may be thinned after deposition. The thinning may be performed, e.g., using a mechanical grinding or CMP process. In some embodiments, the underfill 224 may be deposited over the interconnect structure 200, and the thinning may expose the topmost routing layer 208 of the interconnect structure 200.

Figure 10:
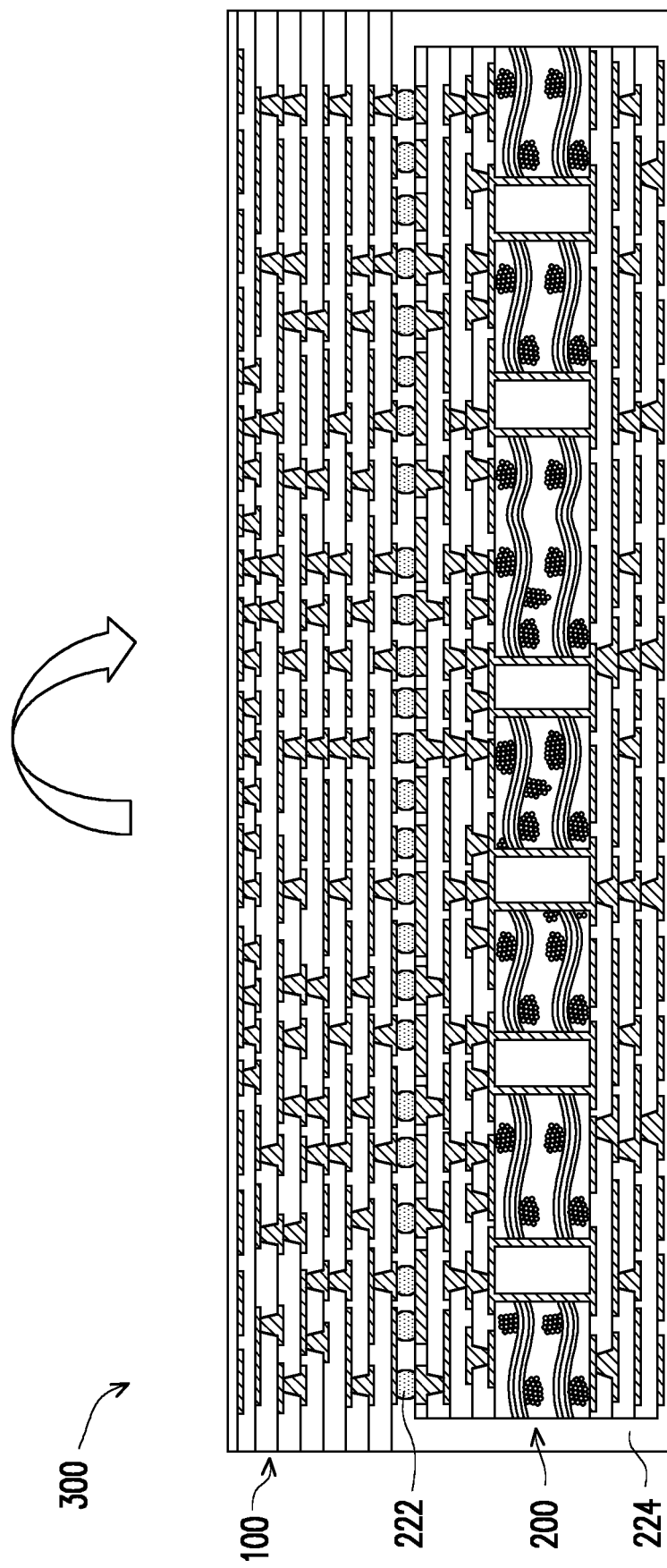

Turning to FIG. 10, the first carrier substrate 102 is de-bonded to detach (or "de-bond") the first carrier substrate 102 from the bonded structure 300. In some embodiments, the de-bonding includes projecting a light such as a laser light or an UV light on the release layer 103 on the first carrier substrate 102 so that the release layer decomposes under the heat of the light and the first carrier substrate 102 can be removed. The bonded structure 300 may also be flipped over, as shown in FIG. 10.

Figure 11:
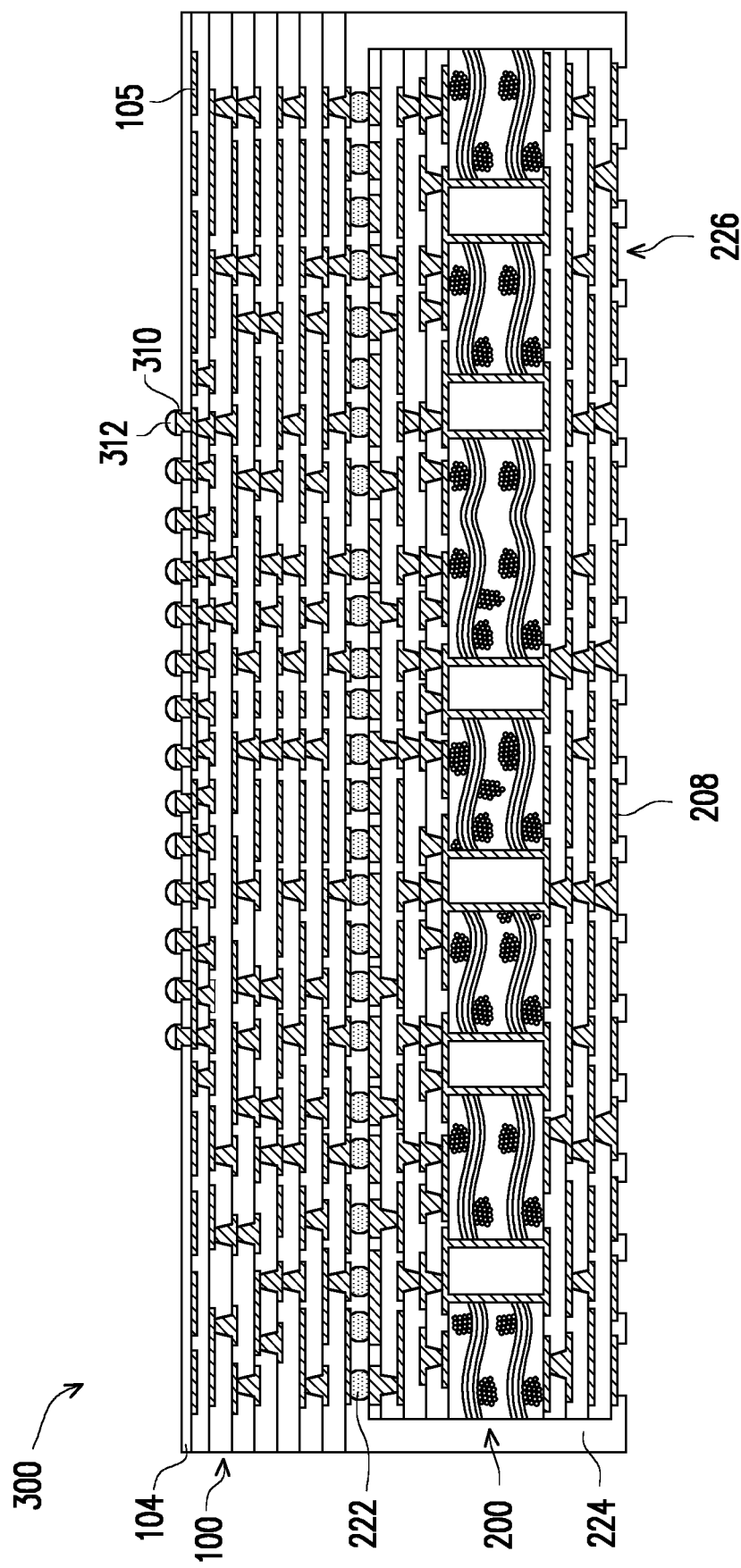

In FIG. 11, under-bump metallizations (UBMs) 310 and external connectors 312 are formed on the bonded structure 300, in accordance with some embodiments. The UBMs 310 extend through the dielectric layer 104 of the redistribution structure 100 and form electrical connections with the metallization patterns (e.g., metallization pattern 105) of the redistribution structure 100. In some embodiments, the UBMs 310 may be formed by, for example, forming openings in the dielectric layer 104 and then forming the conductive material of the UBMs 310 over the dielectric layer 104 and within the openings in the dielectric layer 104. In some embodiments, the openings in the dielectric layer 104 may be formed by forming a photoresist over the dielectric layer 104, patterning the photoresist, and etching the dielectric layer 104 through the patterned photoresist using a suitable etching process (e.g., a wet etching process and/or a dry etching process).

In some embodiments, the UBMs 310 include three layers of conductive materials, such as a layer of titanium, a layer of copper, and a layer of nickel. Other arrangements of materials and layers, such as an arrangement of chrome/chrome-copper alloy/copper/gold, an arrangement of titanium/titanium tungsten/copper, or an arrangement of copper/nickel/gold, may be utilized for the formation of the UBMs 310. Any suitable materials or layers of material that may be used for the UBMs 310 are fully intended to be included within the scope of the current application. The conductive material (e.g., the layers) of the UBMs 310 may be formed using one or more plating processes, such as electroplating or electroless plating processes, although other processes of formation, such as sputtering, evaporation, or a PECVD process, may alternatively be used. Once the conductive material of the UBMs 310 has been formed, portions of the conductive material may then be removed through a suitable photolithographic masking and etching process to remove the undesired material. The remaining conductive material forms the UBMs 310.

Still referring to FIG. 11, external connectors 312 are formed over the UBMs 310, in accordance with some embodiments. In some embodiments, the external connectors 312 may be ball grid array (BGA) connectors, solder balls, controlled collapse chip connection (C4) bumps, micro bumps (e.g., pbumps), electroless nickel-electroless palladium-immersion gold (ENEPIG) technique formed bumps, or the like. The external connectors 312 may include a conductive material such as solder, copper, aluminum, gold, nickel, silver, palladium, tin, the like, or a combination thereof. In some embodiments, the external connectors 312 are formed by initially forming a layer of solder through evaporation, electroplating, printing, solder transfer, ball placement, or the like. Once a layer of solder has been formed on the external connectors 312, a reflow may be performed in order to shape the material into the desired shapes.

In some embodiments, openings 226 may be formed in the underfill 224 to expose a routing layer (e.g., routing layer 208) of the interconnect structure 200. The openings 226 expose portions of the routing layer on which external connectors 230 (see FIG. 13) are subsequently formed. The openings 226 may be formed, for example, by forming a photoresist over the underfill 224, patterning the photoresist, and etching the underfill 224 through the patterned photoresist using a suitable etching process (e.g., a wet etching process and/or a dry etching process).

Figure 12A:
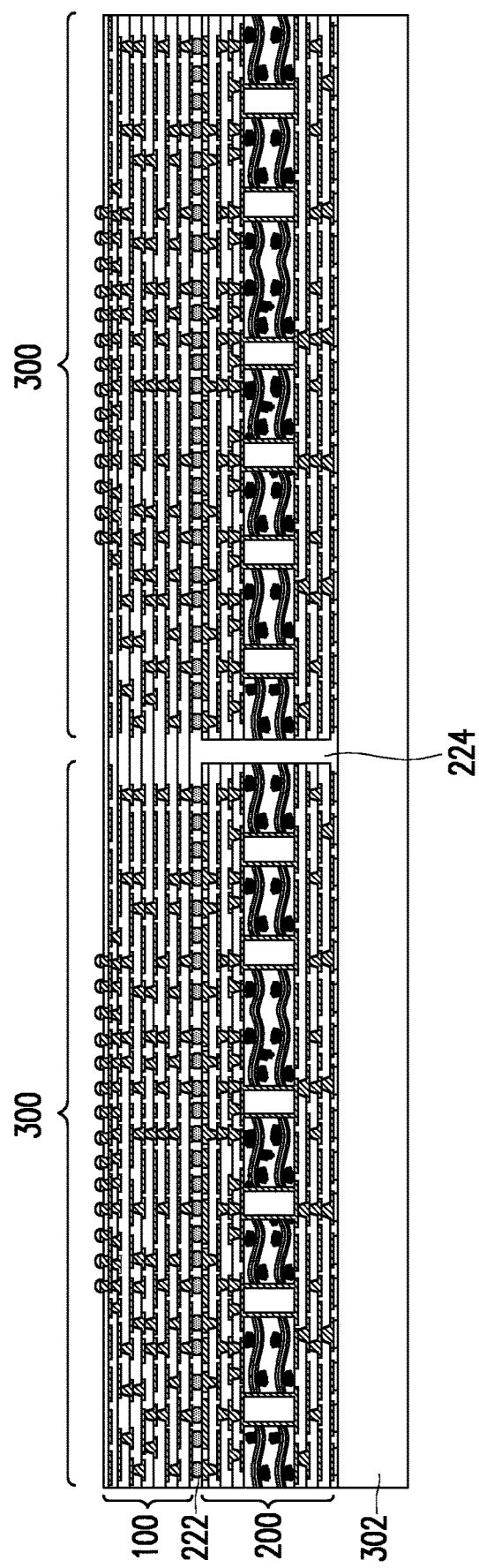
Figure 12B:
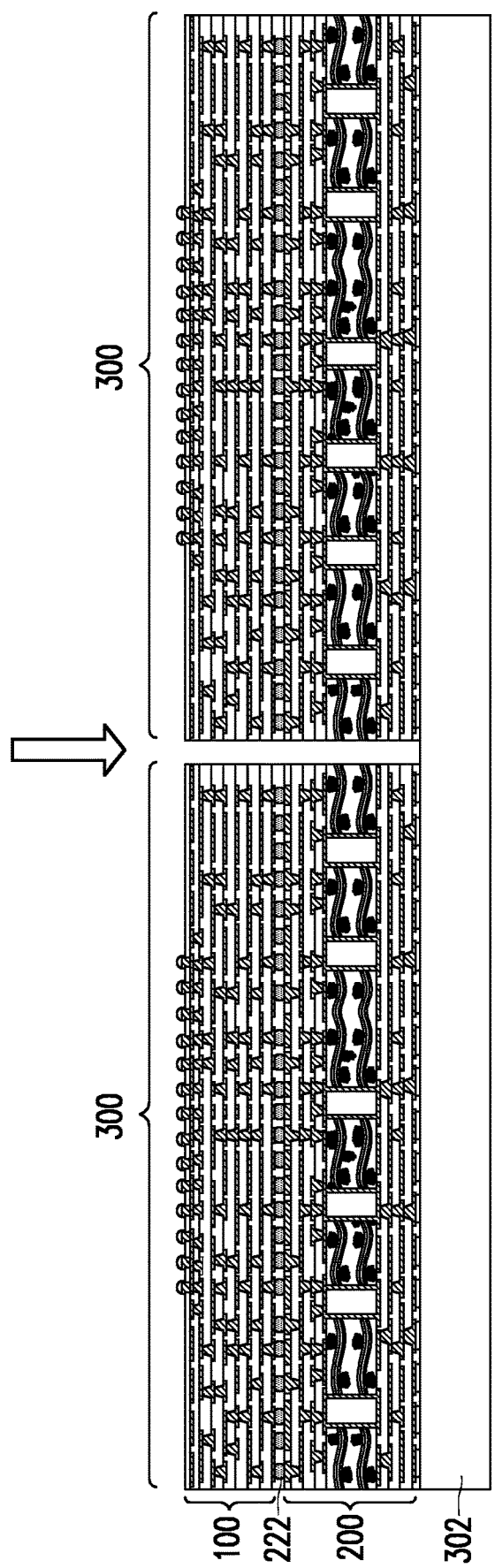

FIGS. 12A and 12B illustrate a singulation process to form individual bonded structures 300. In some embodiments, multiple bonded structures 300 may be formed on the same substrate (e.g. first carrier substrate 102). For example, multiple redistribution structures 100 may be formed on the same substrate, and then multiple interconnect structures 200 may be bonded to the redistribution structures 100 to form the multiple bonded structures 300 as described previously for FIGS. 5-11. As shown in FIG. 12A, the bonded structures 300 may then be attached to a second carrier substrate 302. The second carrier substrate 302 may be a carrier substrate similar to those described above for the first carrier substrate 102. For example, the second carrier substrate 302 may be a wafer similar to that shown in FIG. 14A or a panel similar to that shown in FIG. 14B. A release layer (not shown) may be formed on the second carrier substrate 302 to facilitate attachment of the bonded structures 300 to the second carrier substrate 302. The release layer may be similar to the release layer 104 described previously.

As shown in FIG. 12B, the bonded structures 300 attached to the second carrier substrate 302 may be singulated to form individual bonded structures 300. The bonded structures 300 may be singulated using one or more saw blades that separate the structure into discrete pieces, forming one or more singulated bonded structures 300. However, any suitable method of singulation, including laser ablation or one or more wet etches, may also be utilized. The singulation process may leave underfill 224 remaining on the sidewalls of the interconnect structures 200, or the singulation process may remove underfill 224 from the sidewalls of the interconnect structures 200, as shown in FIG. 12B. After the singulation process, each redistribution structure 100 may have sidewalls that are coplanar with the sidewalls of the bonded interconnect structure 200, or may have sidewalls that are coplanar with underfill 224 remaining on the sidewalls of the bonded interconnect structure 200. In other embodiments, the redistribution structures 100 are singulated prior to bonding with the interconnect structures 200.

Figure 13:
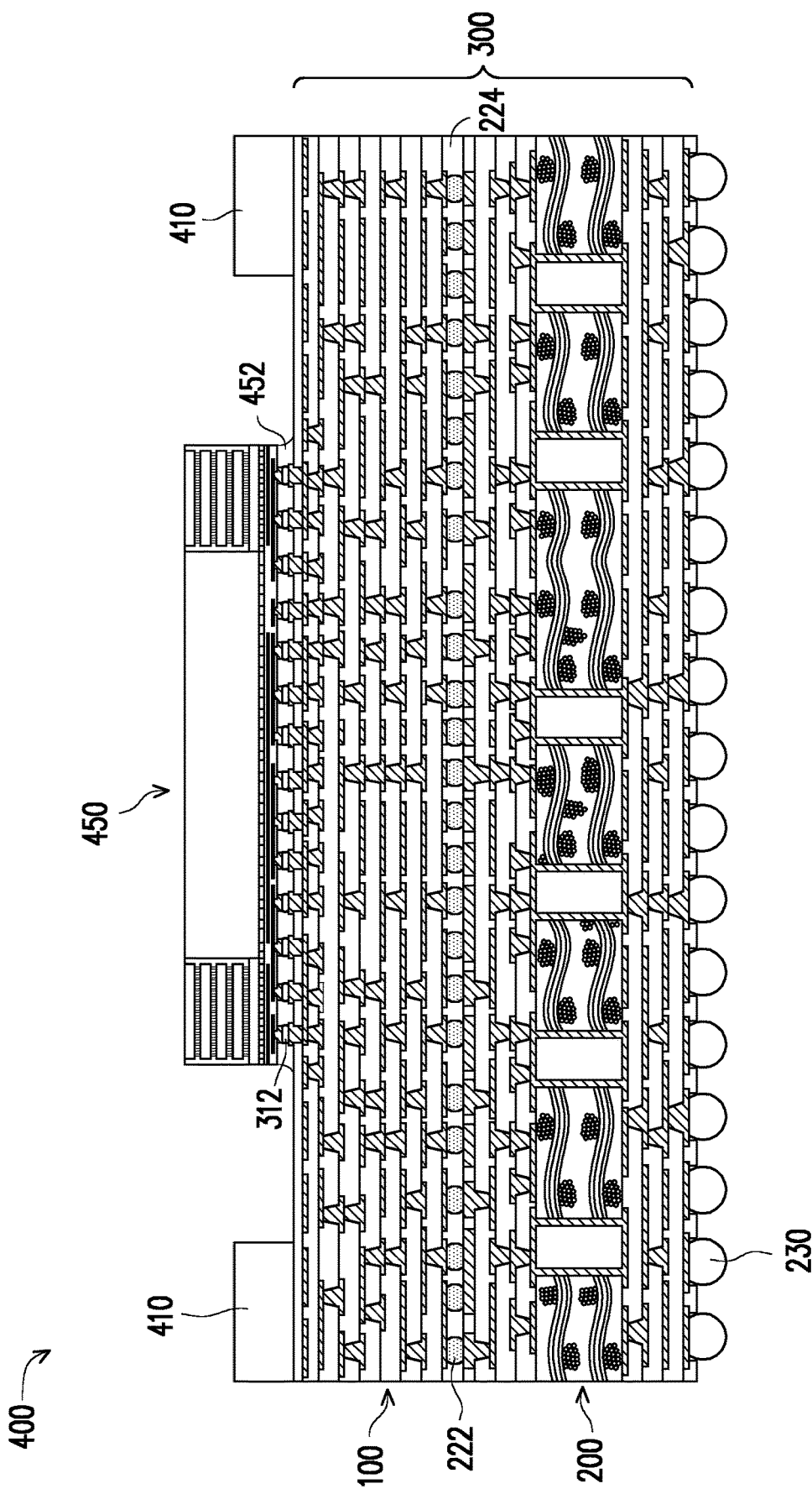
FIG. 13 illustrates a cross-sectional view of a package structure, in accordance with some embodiments.

FIG. 13 illustrates the attachment of a semiconductor device 450 to the bonded structure 300 to form a package structure 400, in accordance with some embodiments. The semiconductor device 450 is physically and electrically connected to the external connectors 312 to make electrical connection between the semiconductor device 450 and the bonded structure 300. The semiconductor device 450 may be placed on the external connectors 312 using a suitable process such as a pick-and-place process. FIG. 13 shows the attachment of one semiconductor device 450, but in other embodiments, one, two, or more than three semiconductor devices may be attached to the external connectors 312. In some embodiments, the semiconductor devices attached to the external connectors 312 may include more than one of the same type of semiconductor device or may include two or more different types of semiconductor devices.

The semiconductor device 450 may include one or more integrated circuit dies such as a logic die (e.g., central processing unit (CPU), graphics processing unit (GPU), system-on-a-chip (SoC), component-on-a-wafer (CoW), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an I/O die, the like, or combinations thereof.

In some embodiments, a semiconductor device 450 may include more than one integrated circuit die, and may include electrical interconnections between the multiple integrated circuit dies such as a redistribution structure, an integrated fan-out structure (InFO), through-substrate vias (TSVs), metallization patterns, electrical routing, or the like. For example, the integrated circuit die may be a memory device such as a hybrid memory cube (HMC) module, a high bandwidth memory (HBM) module, or the like that includes multiple memory dies. The semiconductor device 450 may be, for example, a package.

The semiconductor device 450 may be placed such that conductive regions of the semiconductor device 450 (e.g., contact pads, conductive connectors, solder bumps, or the like) are aligned with corresponding external connectors 312. Once in physical contact, a reflow process may be utilized to bond the external connectors 312 to the semiconductor device 450. As shown in FIG. 13, an underfill 452 may be deposited between the semiconductor device 450 and the bonded structure 300. The underfill 452 may also at least partially surround external connectors 312 or UBMs 310. The underfill 452 may be a material such as a molding compound, an epoxy, an underfill, a molding underfill (MUF), a resin, or the like, and may be similar to underfill 224 described previously.

Still referring to FIG. 13, the second carrier substrate 302 is de-bonded and external connectors 230 may be formed on the interconnect structure 200, in accordance with some embodiments. In some embodiments, the de-bonding includes projecting a light such as a laser light or an UV light on a release layer on the second carrier substrate 302 so that the release layer decomposes under the heat of the light and the second carrier substrate 302 can be removed. The external connectors 230 may be formed in the openings 226 of the interconnect structure 200. In some embodiments, UBMs are first formed on the interconnect structure 200, and the external connectors 230 are formed over the UBMs. The external connectors 230 may be, for example, contact bumps or solder balls, although any suitable types of connectors may be utilized. In an embodiment in which the external connectors 230 are contact bumps, the external connectors 230 may include a material such as tin, or other suitable materials, such as silver, lead-free tin, or copper. In an embodiment in which the external connectors 230 are solder bumps, the external connectors 230 may be formed by initially forming a layer of solder using such a technique such as evaporation, electroplating, printing, solder transfer, ball placement, etc. Once a layer of solder has been formed on the structure, a reflow may be performed in order to shape the material into the desired bump shape for the external connectors 230. In this manner, a package structure 400 may be formed.

In some embodiments, an optional supporting ring 410 is attached to the bonded structure 300 to provide further mechanical support to reduce the warpage of the package structure 400. The supporting ring 410 may be attached to the bonded structure 300 by an adhesive, an adhesive film, or the like. The supporting ring 410 may be a material such as metal, though other materials may be used. In some cases, the outer edges of the supporting ring 410 may be flush with the sidewalls of the bonded structure 300.

Figure 15:
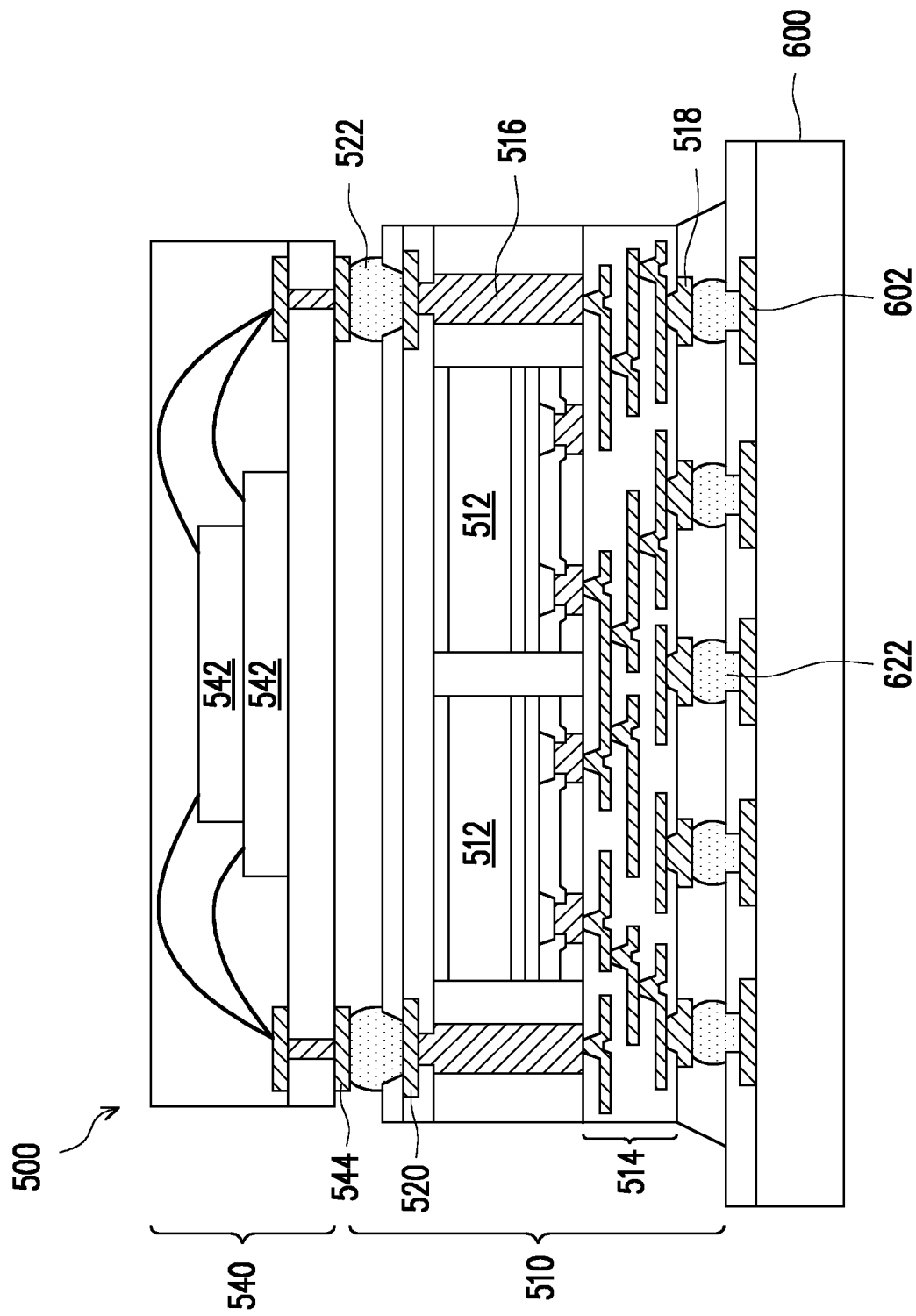
FIG. 15 illustrates a cross-sectional view of a package, in accordance with some embodiments.

Turning to FIG. 15, a package 500 is shown, in accordance with some embodiments. The package 500 may be, for example, a package-on-package (PoP) structure, and may be connected to a package substrate 600 as shown in FIG. 15. In some embodiments, the package 500 is formed from a first package component 510 bonded to a second package component 540. The first package component 510 may include one or more integrated circuit dies 512 and one or more through vias 516 connected to a redistribution structure 514. The integrated circuit dies 512 may be similar to the semiconductor devices 450 described previously. The first package component 510 includes contacts 518 on the redistribution structure 514 that are used to connect to the package substrate 600 and contacts 520 on the through vias 516 that are used to connect to the second package component 540. The second package component 540 may include one or more integrated circuit dies 542, which may be similar to the integrated circuit dies 512 or semiconductor devices 450 described previously, and which may be stacked as shown in FIG. 15. The second package component 540 includes contacts 544 that are used to connect to the first package component 510.

As shown in FIG. 15, connectors 522 may be used to bond the contacts 520 of the first package component 510 to the contacts 544 of the second package component 540, and connectors 622 may be used to bond the contacts 518 of the first package component 510 to contacts 602 of the package substrate 600. In some embodiments, the connectors 522 and/or the connectors 622 may be formed in a manner similar to the connectors 222 described previously. For example, the connectors 622 may be formed by forming regions of LT paste on the contacts 602 of the package substrate 600 and forming solder bumps on the contacts 518 of the first package component, placing the solder bumps on corresponding regions of LT paste, and then performing a LT reflow 130 and a HT reflow 132 to melt the LT paste and solder bumps into the connectors 622. The connectors 522 may be formed in a similar manner, such as by forming regions of LT paste on the contacts 544 and forming solder balls on the contacts 520 and then performing a LT reflow 130 and a HT reflow 132 to form the connectors 522. The LT paste and the solder bumps used for forming the connectors 522 and/or the connectors 622 may be formed on opposite contact pads than in the examples given. In this manner, using the bonding techniques described herein, warping between various bonded components of the package 500 may be reduced. The package 500 is intended as an illustrative example, and other packages or bonded structures using the techniques described herein are considered within the scope of this disclosure.

Other features and processes may also be included in the various embodiments described herein. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and techniques disclosed herein may be used in conjunction with testing methodologies that incorporate intermediate verification of known good dies to increase the yield and decrease costs.

By utilizing the embodiments described herein, the performance of a device package may be improved, and the reliability of a device package may be improved. Different features of embodiments described herein may be combined to achieve these and other benefits. In some cases, the use of a connector formed from a low-temperature solder paste and a solder ball that are joined using a low-temperature reflow followed by a high-temperature reflow as described may improve the conduction and reliability of electrical connections between bonded structures. In some cases, the techniques described herein may be performed in a process flow with other typical fabrication processes, and thus may add little or no additional cost to existing processes. The techniques described herein are also applicable for bonding a variety of structures to form different types of packages. Additionally, using process techniques as described may result in improved yield and improved connection reliability, especially for packages having larger areas. For example, the process techniques described herein may reduce warpage and thus also reduce problems such as cracking or delamination associated with warping.

In some embodiments, a method include forming a redistribution structure including a first metallization pattern on a first side of the redistribution structure; forming an interconnect structure including a second metallization pattern on a first side of the interconnect structure; bonding the interconnect structure to the redistribution structure, including: depositing solder paste on the first metallization pattern, wherein the solder paste is a first material; forming solder balls on the second metallization pattern, wherein the solder balls are a second material that is different from the first material; placing the solder balls in physical contact with the solder paste; performing a first reflow process at a first temperature that melts the solder paste; and after performing the first reflow process, performing a second reflow process at a second temperature that melts the solder paste and melts the solder balls, wherein the second temperature is greater than the first temperature; and after performing the second reflow process, depositing an underfill between the redistribution structure and the interconnect structure. In an embodiment, the solder paste includes tin and bismuth. In an embodiment, the solder balls are bismuth-free. In an embodiment, the first temperature is between 140° C. and 180° C. In an embodiment, the second temperature is between 210° C. and 250° C. In an embodiment, the method includes connecting a semiconductor device to the second side of the redistribution structure. In an embodiment, performing the first reflow process forms temporary connectors between the first metallization pattern and the second metallization pattern, wherein the temporary connectors include a region of the first material bonded to a region of the second material. In an embodiment, performing the second reflow process forms connectors between the first metallization pattern and the second metallization pattern, wherein the connectors have a homogenous composition. In an embodiment, the connectors have between 4% and 20% bismuth by mass. In an embodiment, after performing the second reflow process, the warpage of the interconnect structure is less than 1400 μm.

In some embodiments, a method includes forming regions of solder paste on a redistribution structure, wherein the solder paste has a first melting temperature; forming solder bumps on an interconnect structure, wherein the solder bumps have a second melting temperature that is greater than the first melting temperature; placing the solder bumps on the regions of solder paste; performing a first reflow process at a first reflow temperature for a first duration of time, wherein the first reflow temperature is less than the second melting temperature; and after performing the first reflow process, performing a second reflow process at a second reflow temperature for a second duration of time, wherein the second reflow temperature is greater than the second melting temperature. In an embodiment, the mass ratio of a region of solder paste to a solder bump is between 1:8 and 1:16. In an embodiment, the first duration of time is between 100 seconds and 200 seconds. In an embodiment, the second duration of time is between 50 seconds and 80 seconds. In an embodiment, the interconnect structure includes an organic substrate. In an embodiment, the ratio of a width of a region of solder paste to the width of a solder bump is between 1:2 and 1:4.

In some embodiments, a method of forming a semiconductor package includes depositing solder paste on first contact pads of a first package component, wherein the solder paste comprises bismuth; depositing solder material on second contact pads of a second package component, wherein the solder material is free of bismuth; performing a first heating process at a first temperature that bonds the solder paste to the solder material, wherein the solder material remains a solid during the first heating process; and after performing the first heating process, performing a second heating process at a second temperature that melts the solder paste and the solder material to form connectors that bond the first contact pads and the second contact pads. In an embodiment, the second temperature is between 30° C. and 70° C. greater than the first temperature. In an embodiment, the solder paste has a mass percentage of bismuth between 35% and 58%. In an embodiment, the first temperature is less than 180° C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a redistribution structure comprising a first metallization pattern on a first side of the redistribution structure;
    forming an interconnect structure comprising a second metallization pattern on a first side of the interconnect structure; and
    bonding the interconnect structure to the redistribution structure, wherein bonding the interconnect structure to the redistribution structure comprises:
        depositing solder paste on the first metallization pattern;
        forming solder bumps on the second metallization pattern by a first reflow process;
        placing the solder bumps in physical contact with the solder paste;
        performing a second reflow process at a first temperature that melts the solder paste and transforms the solder paste into solder support structures, wherein the solder bumps remain intact during the second reflow process, and wherein the solder support structures physically couple the solder bumps to the first metallization pattern; and
        after performing the second reflow process, performing a third reflow process at a second temperature that melts the solder support structures and the solder bumps, wherein the second temperature is greater than the first temperature, the third reflow process forming connectors between the first metallization pattern and the second metallization pattern.

2. The method of claim 1, wherein the solder paste comprises bismuth.

3. The method of claim 2, wherein the solder bumps are bismuth-free.

4. The method of claim 3, wherein the connectors have homogenous compositions, and wherein bismuth is evenly distributed in the connectors.

5. The method of claim 1, wherein the connectors have convex or concave sidewalls.

6. The method of claim 1, further comprising, after performing the second reflow process, depositing an underfill between the redistribution structure and the interconnect structure, wherein the underfill extends along sidewalls of the connectors and the first metallization pattern.

7. The method of claim 1, wherein first sidewalls of the connectors are in contact with the first metallization pattern, and wherein the first sidewalls of the connectors are straight.

8. A method comprising:
    forming a plurality of regions of solder paste on a redistribution structure, wherein the solder paste has a first melting temperature;
    forming a plurality of solder bumps on an interconnect structure, wherein the solder bumps have a second melting temperature greater than the first melting temperature;
    placing the plurality of solder bumps on the plurality of regions of solder paste, the plurality of solder bumps being affixed to the interconnect structure;
    performing a first reflow process at a first reflow temperature for a first duration of time, the first reflow process reflowing the plurality of regions of solder paste, the first reflow process transforming the plurality of regions of solder paste into a plurality of solder support structures; and after performing the first reflow process, performing a second reflow process at a second reflow temperature for a second duration of time, wherein the second reflow temperature is greater than the first reflow temperature, wherein the second duration of time is less than the first duration of time, and wherein the second reflow process melts the plurality of solder bumps and the plurality of solder support structures and merges respective solder bumps of the plurality of solder bumps together with respective solder support structures of the plurality of solder support structures.

9. The method of claim 8, wherein a mass ratio of a region of solder paste to a solder bump is between 1:8 and 1:16.

10. The method of claim 8, wherein a ratio of a width of a region of solder paste to the width of a solder bump is between 1:2 and 1:4.

11. The method of claim 8, wherein the first duration of time is between 100 seconds and 200 seconds, and wherein the second duration of time is between 50 seconds and 80 seconds.

12. The method of claim 8, wherein the redistribution structure and the interconnect structure are spaced apart by a first distance before performing a third reflow process, wherein the redistribution structure and the interconnect structure are spaced apart by a second distance after performing a third reflow process, and wherein the second distance is smaller than the first distance.

13. The method of claim 8, wherein merging respective solder bumps of the plurality of solder bumps together with respective solder support structures of the plurality of solder support structures forms conductive connectors, wherein the conductive connectors comprise bismuth.

14. The method of claim 13, wherein bismuth is more concentrated at first locations in the conductive connectors near the redistribution structure than at second locations in the conductive connectors near the interconnect structure.

15. A method of forming a semiconductor package, comprising:

depositing solder paste on first contact pads of a redistribution structure of a first package component, wherein the solder paste comprises bismuth;

depositing solder material on second contact pads of a second package component, wherein the solder material is free of bismuth;

performing a first reflow process to attach the solder material to the second contact pads of the second package component;

performing a second reflow process comprising a first heating process at a first temperature that melts the solder paste and transforms the solder paste into solder bonding structures bonded to the solder material, wherein the solder material remains a solid during the first heating process, and wherein an interface remains between the solder material and the solder bonding structures; and after performing the first heating process and while the solder bonding structures are bonded to the solder material, performing a third reflow process comprising a second heating process at a second temperature that melts the solder bonding structures and the solder material to form connectors that bond the first contact pads and the second contact pads together.

16. The method of claim 15, wherein the first temperature is between 140° C. and 180° C., and wherein the second temperature is between 210° C. and 250° C.

17. The method of claim 15, further comprising:

after performing the second heating process, depositing an underfill material between the first package component and the second package component, the underfill material extending on sidewalls of the second package component; and cutting through the underfill material along the sidewall of the second package component and through the first package component.

18. The method of claim 15, wherein the solder paste has a mass percentage of bismuth between 35% and 58%.

19. The method of claim 15, wherein the connectors have homogeneous compositions, and wherein the connectors comprise between 4% and 20% bismuth by mass.

20. The method of claim 15, wherein the connectors have homogeneous compositions, wherein the connectors further comprise tin, and wherein a mass ratio of tin to bismuth in the connectors is between 5:1 and 8:1.

* * * * *